United States Patent [19]
Shirai et al.

[11] Patent Number: 6,078,636
[45] Date of Patent: Jun. 20, 2000

[54] COUNTER CIRCUIT AND SEMICONDUCTOR MEMORY HAVING COUNTER CIRCUIT AS ADDRESS COUNTER CIRCUIT

[75] Inventors: Yutaka Shirai; Hiroyuki Koinuma, both of Yokohama, Japan

[73] Assignee: Kabushiki Kaisha Toshiba, Kawasaki, Japan

[21] Appl. No.: 08/921,539

[22] Filed: Sep. 2, 1997

[30] Foreign Application Priority Data

Aug. 30, 1996 [JP] Japan .................................. 8-230146

[51] Int. Cl.[7] .................................................. G06M 3/00
[52] U.S. Cl. ...................... 377/26; 365/230.08; 365/233; 365/236; 365/239
[58] Field of Search .................................. 365/233, 236, 365/239, 230.08; 377/26

[56] References Cited

U.S. PATENT DOCUMENTS 5,805,523  9/1998  Lysinger .............................. 365/230.08
5,808,960  9/1998  McClure ................................. 365/233

*Primary Examiner*—Margaret R. Wambach
*Attorney, Agent, or Firm*—Banner & Witcoff, Ltd.

[57] ABSTRACT

A counter circuit, which may be on a semiconductor integrated circuit, that is applicable to both a linear sequence and an interleave sequence and is capable of setting a burst length at 1, 2, 4, 8, or $2^n$ in both sequences. The burst length of the counter circuit may be changeable, and the counter circuit may output a signal indicating whether the count number has reached the burst length.

19 Claims, 12 Drawing Sheets

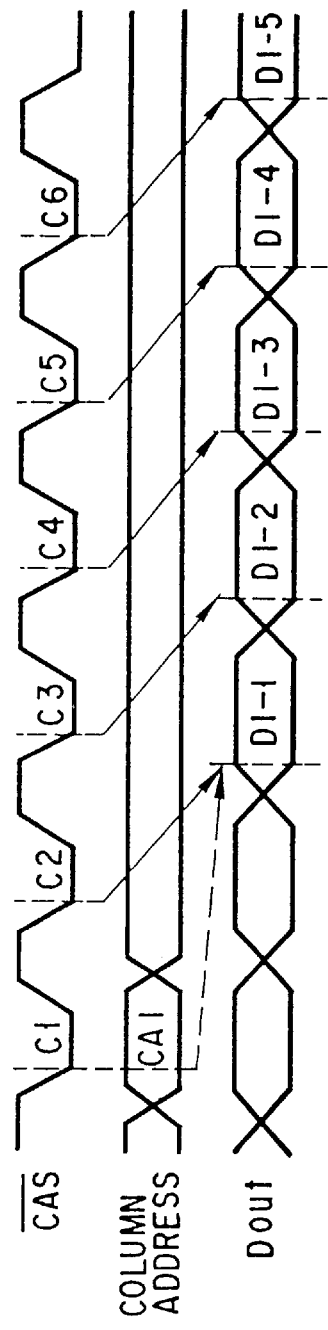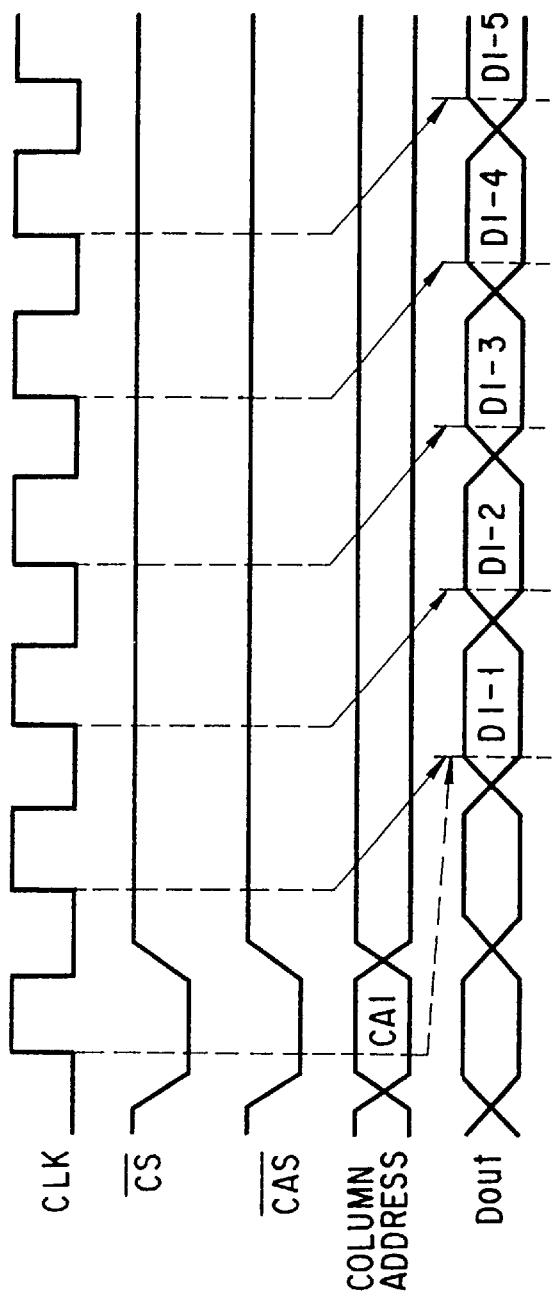
FIG. 1A
FIG. 1B

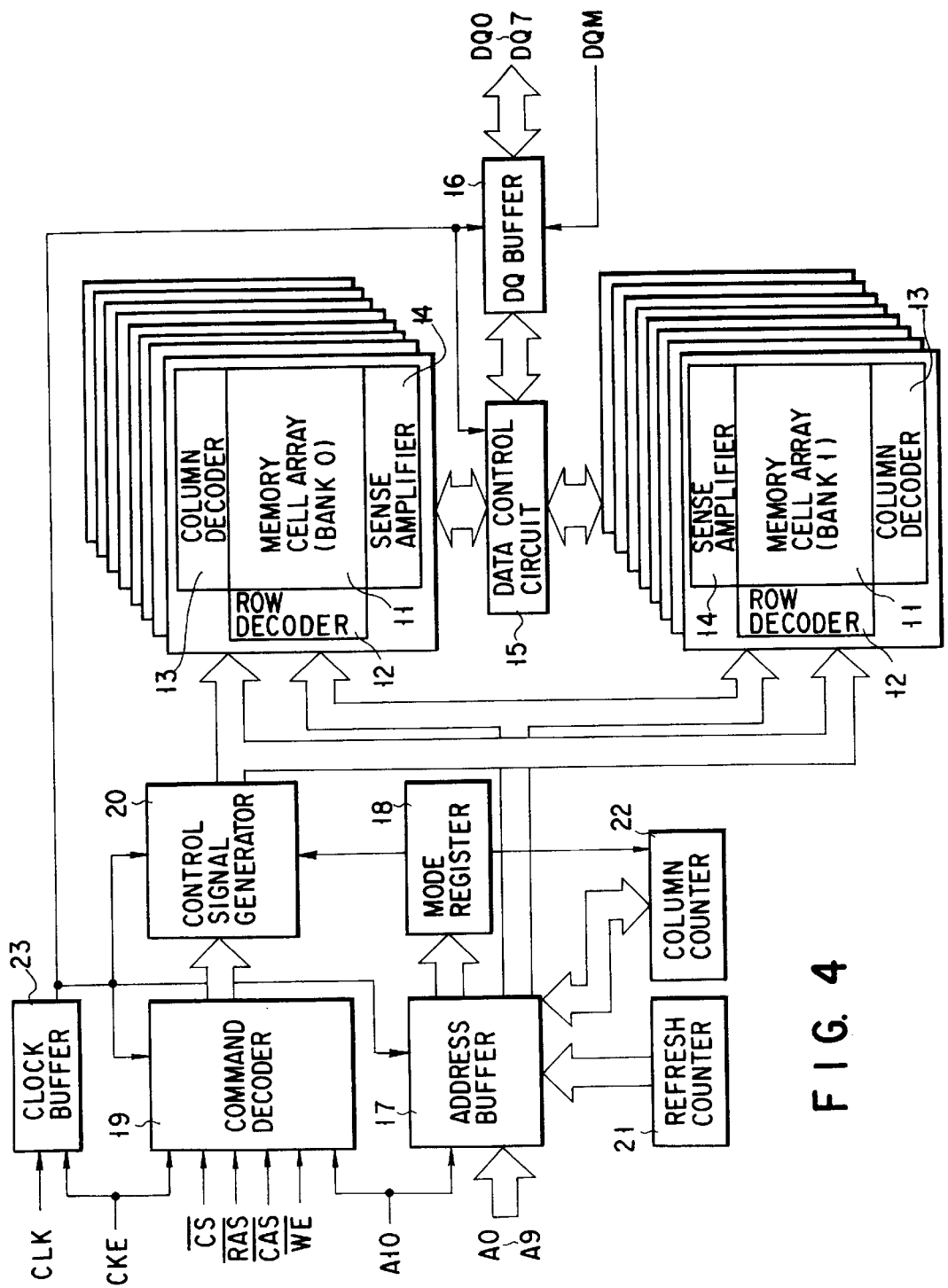
F I G. 4

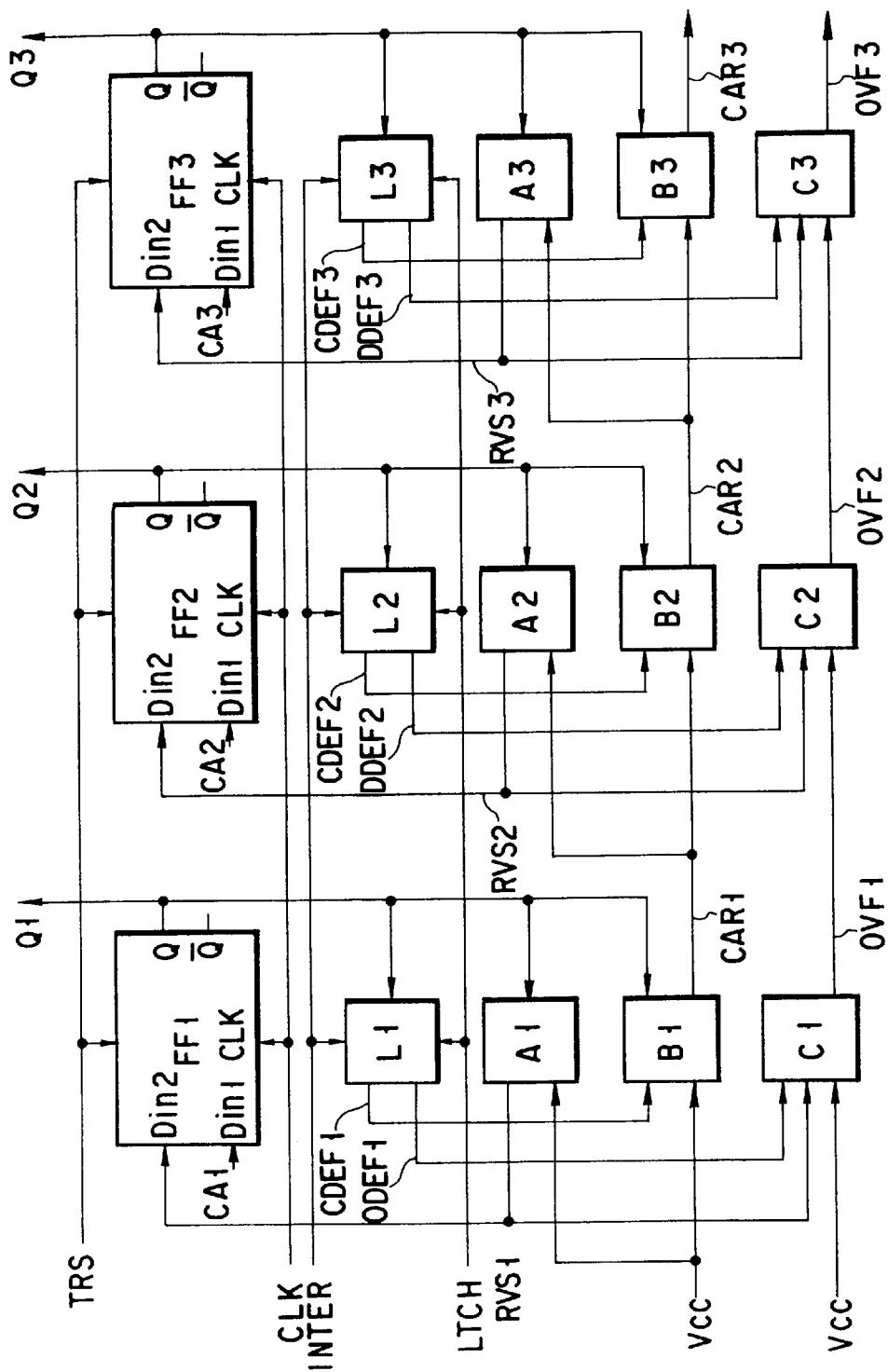
F I G. 5

| CARn-1 | Qn | CDEFn | CARn |
|---|---|---|---|
| 0 | — | — | 0 |
| 1 | 0 | 0 | 0 |
| 1 | 0 | 1 | 1 |
| 1 | 1 | 0 | 1 |
| 1 | 1 | 1 | 0 |

FIG. 16

| OVFn-1 | RVSn | ODEFn | OVFn |
|---|---|---|---|
| 0 | — | — | 0 |
| 1 | 0 | 0 | 1 |
| 1 | 0 | 1 | 0 |
| 1 | 1 | 0 | 0 |
| 1 | 1 | 1 | 1 |

FIG. 17

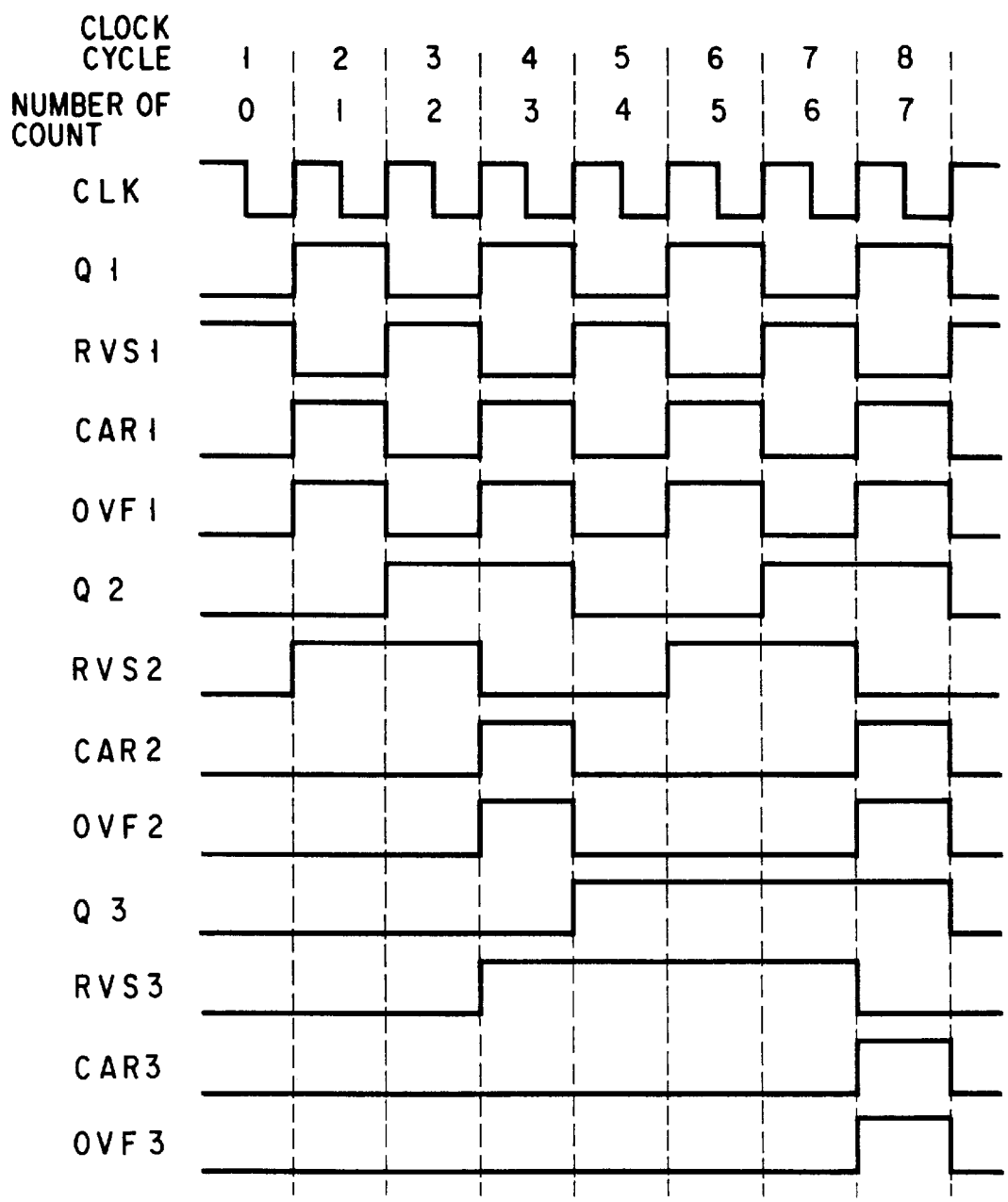
F I G. 19

COUNTER CIRCUIT AND SEMICONDUCTOR MEMORY HAVING COUNTER CIRCUIT AS ADDRESS COUNTER CIRCUIT

BACKGROUND OF THE INVENTION

The present invention relates to a semiconductor memory such as a DRAM and particularly relates to a counter circuit for automatically generating a column address within the memory in a high-speed mode.

A DRAM, one type of a semiconductor memory can operate in first page mode, extended data output (EDO) mode and pipelined burst mode (PBM) no that data may be transferred at high speed between it and a CPU which operates at high speed. Recently, a synchronous DRAM has been developed which operates at high speed.

A DRAM operates in PBM as is illustrated in FIG. 1A. A synchronous DRAM operates as is shown in FIG. 1B. In both the DRAM and the synchronous DRAM, a column address is generated from a column address signal (CA1) which has been fetched from an external device. In the DRAM, a column address strobe signal /CAS at "1" level is set at "0" level. In the synchronous DRAM, a clock signal CLK at "0" level is set at "1" level. The data signals are thereby continuously read from the DRAM and the synchronous DRAM a plurality of times (D1-1, D-2, . . . ). This data-reading scheme is called "burst read". Generally, the burst length is set at 1, 2, 4, 8, . . . , or $2^n$ by using a mode register.

FIG. 2 shows a conventional counter circuit designed to generate a column address which is used to operate a DRAM or a synchronous DRAM, thereby to accomplish burst read (or burst write). The counter circuit is a four-bit circuit, that is, has a burst length of 16. It consists of four D-type flip-flop circuits 101 to 104, four Exclusive-NOR gate circuits 105 to 108 three NAND gate circuits 109 to 111 and three inverters 112 to 114. A clock signal CLK is supplied to a synchronization signal input terminal in each D-type flip-flop circuit.

In FIG. 2, as regards n-th bit, the input terminal D of the D-type flip flop circuit is supplied with the output signal EXNORn (n=1, 2, . . . ) of the corresponding n-th bit Exclusive-NOR gate circuit. The output Q of the D-type flip-flop circuit is outputted as a count signal Qn of the n-th bit. To one of the input terminals of the Exclusive-NOR gate circuit, the count signal Qn of the corresponding n-th bit D-type flip-flop circuit is supplied. To the other input terminal thereof, an output signal of the corresponding n-th bit NAND gate circuit is supplied. To one of the input terminals of NAND gate circuit, the output signal Qn-1 of the (n-1)th bit D-type flip-flop circuit is supplied. The output signal of the (n−1)-th bit Exclusive NOR gate circuit is supplied to the other input terminal of the NAND gate circuit through the corresponding n-th bit inverter. As regards the first bit, neither an NAND gate circuit nor an inverter is provided and a ground potential VSS ("0" level) is supplied to the other input terminal of the Exclusive-NOR gate circuit.

In the counter circuit of such an arrangement, count signals Q1 to Q4 are sequentially changed synchronously with a clock signal CLU as indicated by the timing chart of FIG. 3. FIG. 3 illustrates a case where counting starts from the count number 0 where Q1 to Q 4 are all at "0" level. At this time, "0" level is supplied to the other input terminal of the first bit Exclusive-NOR gate circuit 105. Therefore, if the count signal Q1 supplied to one input terminal of the Exclusive-NOR gate circuit 105 is "0" level, the output signal EXNOR 1 is "0" level. From this, it is understood that the first bit flip-flop circuit 101 to which input terminal D the signal EXNOR 1 is supplied to, outputs a signal at a level opposite to that of a one-cycle prior output every time the clock signal CLK turns to "1" level. In other words, as shown in FIG. 3, the count signal Q1 advances by half a cycle of the clock signal CLK.

Meanwhile, an output signal EXNOR2 of the second bit Exclusive-NOR gate circuit 106 is inverted every time the signal EXNOR2 turns to "0" level. The output signal EXNOR2 of the second bit flip-flop circuit 102, to which input terminal D the signal EXNOR 2 is supplied, consequently advances by half a cycle of the signal Q1 changed in the same cycle as that of the signal EXNOR2. Likewise, an output signal Q3 of the third bit flip-flop circuit 103 advances by half a cycle of the output signal Q2 of the second bit flip-flop circuit 102. An output signal Q4 of the fourth bit flip-flop circuit 104 advances by half a cycle of the output signal Q3 of the third bit flip flop circuit 103. Therefore, it the count signals Q1 to Q4 of the flip-flop circuits 101 to 104 are based on the binary system, the count circuit conducts four-bit-length upcount operation while using the clock signal CLK as a synchronization signal.

Such sequence where the count number is sequentially increased is referred to as linear sequence. In the linear sequence, the count number is increased one by one as long as a clock signal continues to be supplied.

In the meantime, the above-described conventional counter circuit is only applicable to linear sequence. The PBM or a burst read (or burst write) of a synchronous DRAM requires count operation referred to as interleave sequence in addition to the linear sequence mentioned above. The conventional counter circuit, however, cannot be applied to the interleave sequence and therefore another counter circuit dedicated to the interleave sequence is required.

To effect burst read (or burst write), the burst operation must be terminated upon detecting that the column address has been generated for the burst length. To start the burst operation again, a new column address must be fetched from the external device. Hence, it is necessary to detect whether or not the count of the column counter has reached a predetermined value.

BRIEF SUMMARY OF THE INVENTION

The present invention baa been made in consideration of the above circumstances. It is therefore an object of the present invention to provide a counter circuit applicable to both linear sequence and interleave sequence.

It is another object of the present invention to provide a counter circuit having a function of outputting a signal indicating that the count number reaches a predetermined value, and to provide a semiconductor memory using the counter circuit.

The present invention provides a counter circuit for counting a number represented by n bits ranging from lowest to highest significance, the counter circuit comprising: first to n-th flip-flop circuits each corresponding to a different one of the n bits, each having a first signal input terminal, a second signal input terminal and a count signal output terminal, each for receiving a synchronization signal, for receiving, in a first cycle of the synchronization signal when counting starts, a first signal inputted into said first signal input terminal and outputting an output signal in accordance with the first input signal from the count signal output terminal while the snychronization signal remains in a first logic state, for latching the output signal in accordance with said first input signal while the synchronization signal remains in a second logic state following the first logic state, for receiving, in a cycle following the first cycle of the synchronization signal after the counting starts, a second input signal inputted into said second input signal terminal while the synchronization signal remains in the first logic state, and for outputting the output signal in accordance with said second inout segnal from the count signal terminal while the synchronization signal remains in the second logic state following the first logic state, thereby obtaining first n-th bit count signals; first to n-th bit latch circuits each corresponding to a different one of the n bits, each for receiving the output signal from said flip-flop circuit corresponding to the same bit, and in the first cycle of said synchronization signal when counting starts, for latching the output signal from the flip-flop circuit corresponding to the same bit and outputting first and second signals, and for setting a logic level of said second signal in accordance with a control signal irrespective of a logic level of the output signal from the flip-flop circuit corresponding to the same bit; first to n-th bit, first logic circuits, each corresponding to a different one of the n bits, each for receiving the output signal from said flip-flop circuit corresponding to the same bit, each of the second to n-th, first logic circuits for receiving a carry signal, for outputting a third signal when the output signal from the flip-flop circuit corrresponging to the same bit and the carry signal differ in logic level, and for feeding the third signal as said first input signal to said flip-flop circuit corresponmding to the same bit; and first to n-th, second logic circuits, each corresponding to a different one of the n bits, each for receiving the output signal from said flip-flop circuit corresponding to the same bit, each of the second to n-th, second logic circuits for receiving the carry signal from one of the second logic circuits corresponding to a less significant bit and said second signal outputted from the latch circuit corresponding to the same bit, and outputting said carry signal to one of each of the first and second logic circuits corresponding to a more significant bit when the output signal from the corresponding flip-flop circuit and the second signal outputted from the latch circuit corresponding to the same bit differ from each other in logic level.

The present invention also provides a semiconductor memory comprising: a burst counter circuit for operating in accordance with both a linear sequence and an interleave sequence, said burst counter having a changeable burst length; and a control circuit for receiving an address signal, controlling said burst counter circuit in accordance with the address signal such that said burst counter circuit operates in one of said linear sequence and said interleave sequence, and outputting to said burst counter circuit a control signal for setting the furst length of said burst counter circuit.

Furthermore, the present invention provides a semiconductor memory comprising a memory cell array having a plurality of memory cells, a plurality of word lines and a plurality of bit lines, each of said plurality of memory cells being arranged at an intersection of one of said word lines and one of said bit lines; an address buffer for receiving an address signal and generating an internal address signal from the address signal; a row decoder for receiving said internal address signal and selecting one of the word lines within said memory cells based on the internal address signal; a burst counter circuit operable in accordance with a linear sequence and an interleave sequence, for generating an internal column address signal used when a burst mode operation is executed, the internal column address signal representing n bits ranging from lowest to highest significance, the burst counter circuit for supplying the internal column address signal to said address buffer; a mode setting circuit for generating a mode setting signal and supplying the mode setting signal to said burst counter circuit, a sequence mode of said burst counter circuit being set according to the mode setting signal; and a column decoder for generating a column selection signal for selecting a bit line within said memory cell arrays based on the internal address signal from said address buffer, wherein said burst counter circuit comprises first to n-th flip-flop circuits, each corresponding to a different one of the n bits, each having a first signal input terminal, a second signal input terminal and a count signal output terminal, for receiving a synchronization signal, for receiving, in a first cycle of the synchronization signal when counting starts, a first input signal inputted into said first signal input terminal and outputting an output signal in accordance with the first input signal from the count signal output terminal while the synchronization signal remains in a first logic state, for latching the output signal in accordance with said first input signal while the synchronization signal remains in a second logic state following the first logic state, for receiving, in a cycle following the first cycle of the synchronization signal after the counting starts, a second input signal inputted into said second input signal terminal while the synchronization signal is in the first logic state, and for outputting the output signal in accordance with said second input signal from the count signal output terminal while the synchronization signal remains in the second logic state following the first logic state, thereby obtaining first to n-th bit count signals; first to n-th latch circuits, each corresponding to a different one of the n bits, each for receiving the output signal from said flip-flop circuit corresponding to the same bit, and in the first cycle of said synchronization signal when the counting starts, for latching the output signal from the flip-flop circuit corresponding to the same bit and outputting first and second signals, and for setting a logic level of said second signal in accordance with a control signal irrespective of a logic level of the output signal from the flip-flop circuit corresponding to the same bit; first to n-th, first logic circuits, each corresponding to a different one of the n bits, each for receiving the output signal from said flip-flop circuit corresponding to the same bit, for receiving a carry signal, for outputting a third signal when the output signal from the flip-flop circuit corresponding to the same bit and the carry signal differ in logic level, and for feeding the third signal as said first input signal to said flip-flop circuit corresponding to the same bit; and first to n-th, second logic circuits, each corresponding to a different one of the n bits, each for receiving the output signal from said flip-flop circuit corresponding to the same bit, each of the second to n-th second logic circuit for receiving said carry signal from one of the second logic circuits corresponding to a less significant bit and said second signal outputted from the latch circuit corresponding to the same bit, and outputting said carry signal to one of each of the first and second logic circuits corresponding to a more significant bit when the output signal from the corresponding flip-flop circuit and the second signal outputted from the latch circuit corresponding to the same bit differ from each other in logic level.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims .

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of la the invention.

FIG. 1A is a timing chart showing an example of operations of a memory in a pipeline burst mode of a DRAM;

FIG. 1B is a timing chart showing an example of operations of a memory in a pipeline burst mode of a synchronous DRAM;

FIG. 4 is a block diagram showing the circuit arrangement within a chip if a semiconductor memory having a counter circuit is used as a synchronous DRAM;

FIG. 5 is a block diagram showing an example of a detailed structure of a burst counter used in the synchronous DRAM of FIG. 4;

FIG. 16 shows truth values of input/output signals of the first logic circuit of FIGS. 13A and 13B;

FIG. 17 shows truth values of input/output signals of the second logic circuit of FIGS. 14A and 14B;

FIG. 19 is a timing chart showing an example of the operation of the burst counter of FIG. 5 in the linear sequence.

DETAILED DESCRIPTION OF THE INVENTION

Figure 2:
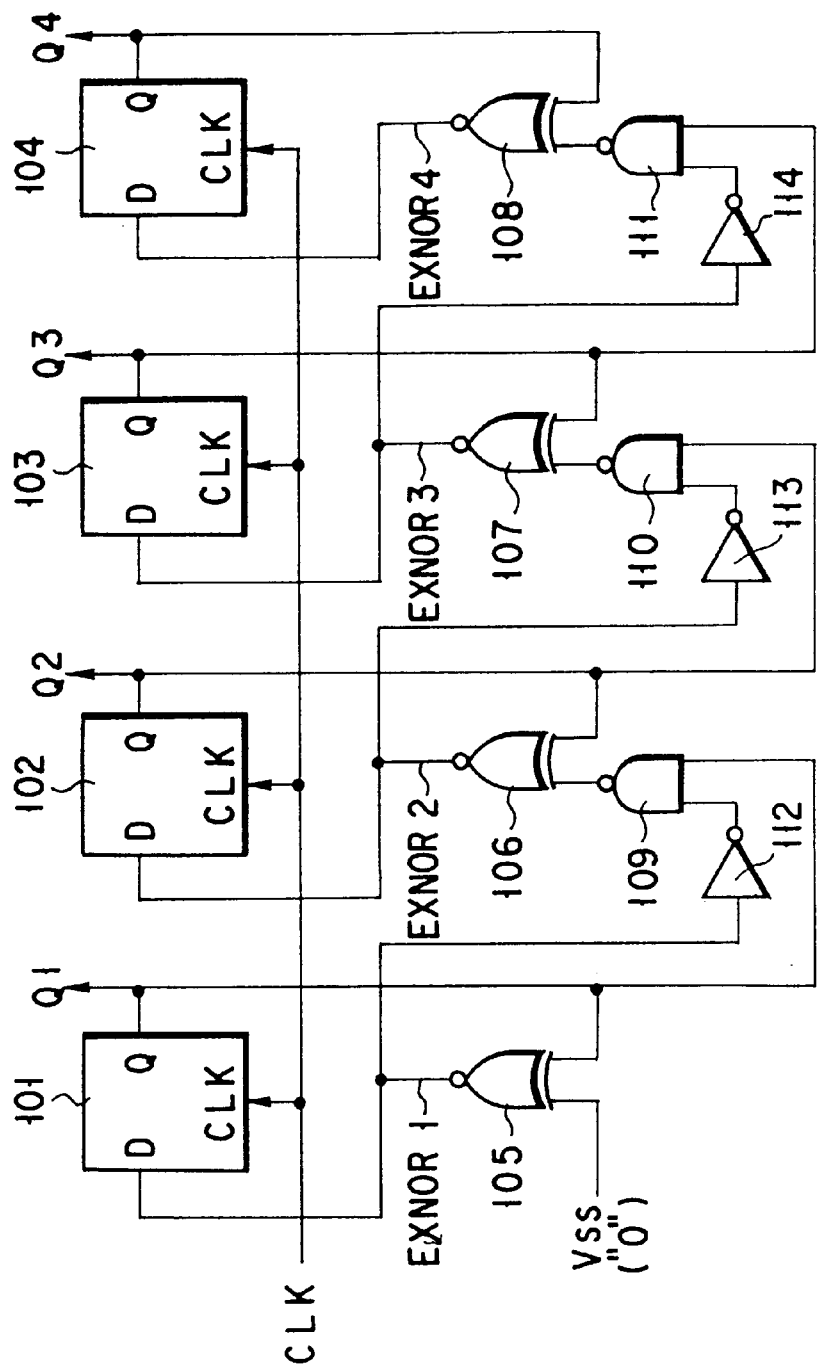
FIG. 2 is a circuit diagram showing the conventional counter circuit.
Figure 3:
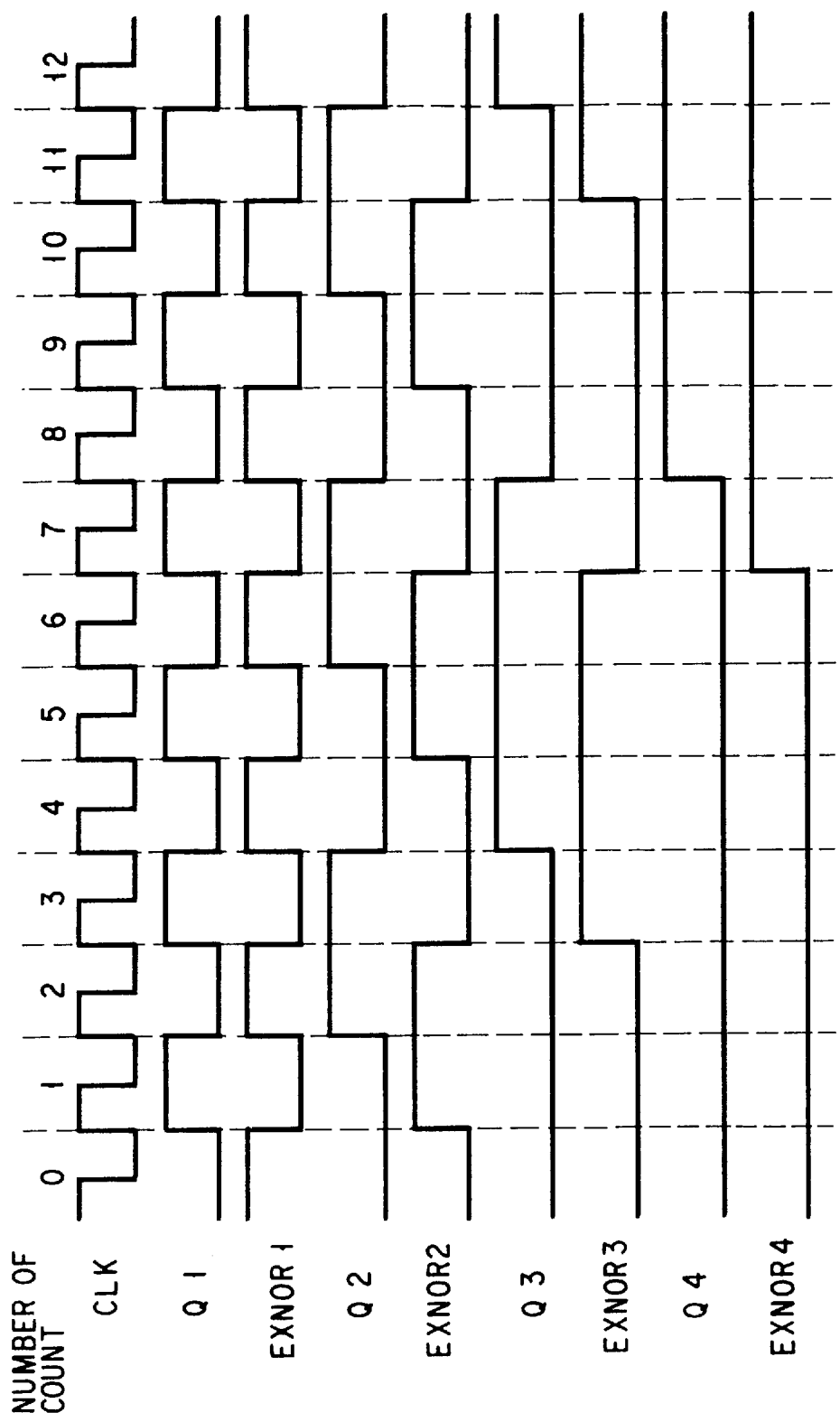
FIG. 3 is a timing chart showing an example of operations of the conventional counter circuit.

The present invention will be described with reference to the drawings.

In a synchronous DRAM chip shown in FIG. 4, a reference numeral 11 denotes a memory cell array. There are two memory cell arrays, i.e. a bank 0 and a bank 1. In each of the memory cell arrays, there are provided a plurality of memory cells, a plurality of word lines and a plurality of bit lines. Each of the plural memory cells are arranged on the intersection of a word line and a bit line. A row decoder 12 selecting a word line within the memory cell array 11, a column decoder 13 outputting a column selection signal for selecting a bit line within the memory cell array 11 and a sense amplifier 14 sensing a read signal from a memory call are provided adjacent to each of the memory cell arrays 11. A data control circuit 15 is connected to each of the sense amplifiers 14. A DQ buffer 16 is connected to the data control circuit 15. The data control circuit 15 feeds data sensed by each sense amplifier 14 to the DQ buffer 16 when data is read from a memory cell. The data control circuit 15 feeds write data supplied to the DQ buffer 16, to each amplifier 14 when data is written into the memory cell. DQ lines DQ0 to DQ7 are connected to the DQ buffer 16.

Address signals (A0 to A9) of, for example 10 bits, supplied from outside are inputted into an address buffer 17. The address buffer 17 generates internal address signals from the address signals (A0 to A9). The internal address signals are fed to the row decoder 12 and the column decoder 13. Some or all of the internal address signals are inputted into a mode register 18. The mode register 18 stores a mode signal corresponding to an internal address.

Various control signals, such as a chip select signal /CS, a row address strobe signal /RAS, a column address strobe signal /CAS and a write enable signal /WE, and the most significant bit address signal A10 are inputted into a command decoder 19. A clock enable signal CKE is also inputted into the command decoder 19. The command decoder 19 decodes the various control signals and the most significant bit address signal A10 and feeds decoded outputs to a control signal generator 20. In addition to the decoded outputs, the storage content of the mode register 19 is fed to the control signal generator 20. The control signal generator 20 generates various control signals for controlling operations within the chip based on these inputs. These control signals are supplied to the row decoder 12, the column decoder 13, the sense amplifier 14 and the like.

A refresh counter 21 generates a particular refresh address signal different from the address signal supplied from outside of the chip. The refresh address signal is fed to the address buffer 17. A column counter 22 generates a column address signal for use in a burst mode when the burst operation is executed. The address signal generated by the column counter 22 is also fed to the address buffer 17.

A clock buffer 23 receives an external clock signal CLK supplied from outside of the chip and the clock enable signal CKE and generates an internal clock signal. The internal clock signal is supplied to the DQ buffer 16, the address buffer 17, the command decoder 19, the control signal generator 20, the column counter 22 and the like.

The column counter 22 generates an internal column address in the burst mode and is applicable to both linear sequence and interleave sequence. A mode setting signal designating the sequence in which an internal address is generated, and also designating the burst mode period is supplied to the column counter 22 from the mode register 18. The column counter 22 operates in either the linear sequence or the interleave sequence when the internal address signal inputted into the mode register 18 from the address buffer 17 is in a specific logic state.

In the synchronous DRAM with this structure, a word line and a bit line within the memory cell array 11 are selected based on outputs of the row decoder 12 and the column decoder 13 according to the row address signal and the column address signal supplied separately twice from outside of the DRAM chip as the address input signals A0 to A9 when data is written and read in an ordinary mode. A memory cell within the memory cell array 11 existing on the intersection of the selected word line and bit line is selected. As for data writing, data is written into the selected memory cell through the DQ buffer 16, the data control circuit 15 and the sense amplifier 14. As for data reading, read data is outputted to the outside of the chip through the sense amplifier 14, the data control circuit 15 and the DQ buffer 16.

When an auto refresh command is set in the command decoder 19, the refresh counter 21 generates an address counter for use in refresh operation so as to sequentially select all word lines within the memory cell array 11 in a predetermined cycle. Therefore, data is read in a predetermined cycle, irrespectively of the address signal supplied from the outside of the chip in all of the memory cells connected to respective word lines within the memory cell array 11. When data is read from the memory cells, the sense amplifier is controlled to conduct sense operation and the data stored in the memory cells and read to the respective bit lines is written into the original memory cells again. In this way, the auto refresh operation of the memory cell is executed.

In the burst mode, a count is set in the column counter on the basis of the contents of the mode resister 18. The count thus set represents in which sequence, the linear sequence or the interleave sequence, an internal address signal should be generated, and for how many cycles it should be generated. Also in the burst mode, the column counter 22 generates internal address signals (i. e., column address signals) sequentially. These address signals, which correspond to the burst length present, are supplied to the address buffer 17. As a result, bit lines within the memory cell array 11 are continuously selected based on outputs of the column decoder 13 in accordance with the internal address signals. The high-speed data read operation is thus realized.

FIG. 5 shows a detailed circuit arrangement of the column counter 22 used in the synchronous DRAM of FIG. 4. The column counter 22 consists of three bits, that is, has a burst length of at most eight. The column counter 22 comprises three flip-flop circuits FF1 to FF3, three latch circuits L1 to L3, three first logic circuits A1 to A3, three second logic circuits B1 to B3 and three third logic circuit C1 to C3.

Each of the three flip-flop circuits FF1 to FF3 has a first input terminal Din1, a second input terminal Din2, an input terminal for a transfer control signal TRS and an input terminal and output terminal Q (/Q) for an internal clock signal (to be referred to as a clock signal for brevity). Each flip-flop circuit FFn (n=1, 2 and 3) takes in one of input signals supplied to the first input terminal Din1 and the second input terminal Din2 in accordance with the logic level of the transfer control signal TRS, and changes the signal level of the output terminal Q (/Q) synchronously with the clock signal CLK. A signal RVSn outputted from the first logic circuit An of the corresponding n-th bit, is supplied to the second input terminal Din2 of each of the three flip-flop circuit FF1 to FF3. Less significant three bit signals CA1 to CA3 of the internal column address signal outputted from the column address buffer 17, are supplied to the first input terminal Din1. The count output signals Q1 to Q3 from the output terminal Q (or /Q) of the three flip-flop circuits FF1 to FF3 are supplied to the address buffer 17 as internal column address signals of the less significant three bit.

Each of the three latch circuits L1 to L3 has an input terminal for a control signal INTER set based on the storage content of the mode register 18, an input terminal for a latch control signal LTCH, an input terminal supplied with a count output signal Qn from the corresponding n-th bit flip-flop circuit FFn and output terminals for two latch signals CDEFn and ODEFn.

Each of the three first logic circuits A1 to A3 has an input terminal supplied with a count output signal Qn from the corresponding n-th bit flip-flop circuit FFn, an input terminal for a carry signal CARn to be described later and an output terminal for a signal RVSn.

Each of the three second logic circuits B1 to B3 has an input terminal supplied with a count output signal Qn from the corresponding n-th bit flip-flop circuit FFn, an input terminal supplied with one of the latch signal CDEFn outputted from the corresponding n-th bit latch circuit Ln, an input terminal supplied with a carry signal CARn-1 outputted from the less significant bit second logic circuit and an output terminal for a carry signal CARn supplied to the more significant bit second logic circuit.

Each of the three logic circuit C1 to C3 has an input terminal supplied with the other latch signal ODEFn outputted from the corresponding n-th bit latch circuit Ln, an input terminal for a signal RVSn outputted from the corresponding n-th bit first logic circuit An, an input terminal for an overflow signal OVFn-1 outputted from the less significant bit-side third logic circuit and an output terminal for an overflow signal QVFn supplied to the more significant bit-side third logic circuit.

It is noted that a power supply potential VCC ("1" level) instead of the carry signal CAR is supplied to the first bit first and second logic circuits A1 and B1. A power supply potential VCC ("1" level) instead of the overflow signal OVF is supplied to the first bit third logic circuit Cl.

Figure 6:
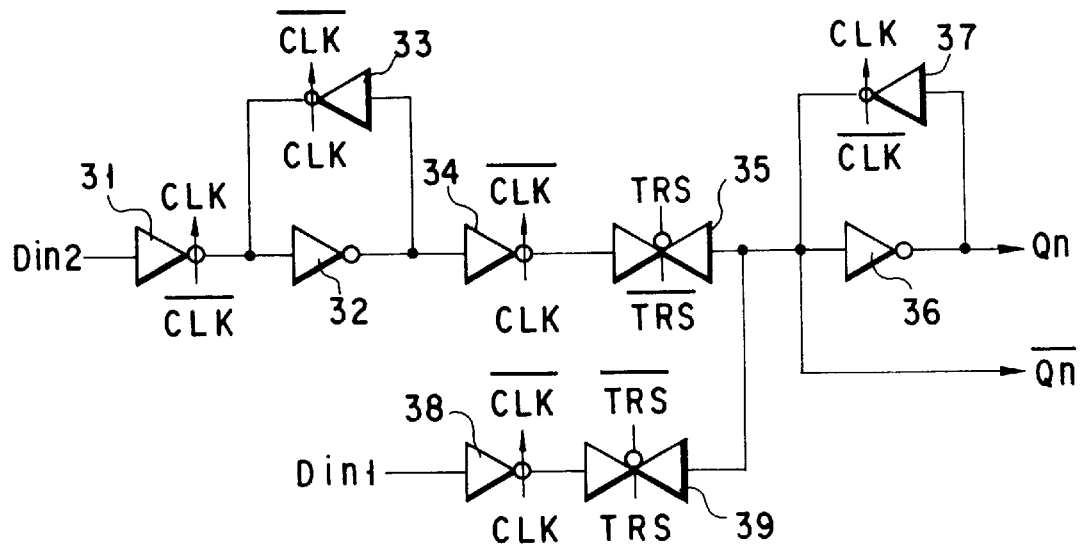
FIG. 6 is a circuit diagram showing an example of a flip-flop circuit within the burst counter of FIG. 5.

FIG. 6 shows an example of the detailed circuit arrangement of the flip-flop circuit FFn shown in FIG. 5. A signal supplied to the second input terminal Din2, is supplied to the clocked inverter 31. A clocked inverter 31 operates and inverts an input when the clock signal CLK is "0" level and a clock signal /CLK complementary to the CLK is "1" level. The output of the clocked inverter 31 is supplied to an inverter 32. The output of the inverter 32 is supplied to clocked inverters 33 and 34. One of the clocked inverters 33 operates and inverts an input when the clock signal CLK is "1" level and the clock signal /CLK is "0" level. The output is returned to the input terminal of the inverter 32, The other clocked inverter 34 operates and inverts an input when the clock signal CLK is "1" level and the clock signal /CLK, is "0" level as in the case of the clocked inverter 33. The output of the clocked inverter 34 is supplied to a transfer gate 35. The transfer gate 35 is conductive when the transfer control signal TRS is "0" level and a signal /TRS complementary to TRS is "1". The signal passed through the transfer gate 35 is supplied to an inverter 36. The output of the inverter 36 is outputted as the count signal Qn and supplied to a clocked inverter 37. The clocked inverter 37 operates and inverts an input when the clock signal CLK is "0" level and the clock signal /CLK is "1" level. The output is returned to the input terminal of the inverter 36, The signal of the input terminal of the inverter 36 is outputted as the count signal /Qn.

The signal supplied to the first input terminal Din1 is supplied to a clocked inverter 38. The clocked inverter 38 operates and inverts an input when the clock signal CLK is "1" level and the clock signal /CLK is "0" level. The output of the inverter 38 is supplied to a transfer gate 39. The transfer gate 39 becomes conductive when the transfer control signal TRS is "1" level and the signal /TRS is "0" level. The signal passed through the transfer gate 39 is supplied to the inverter 36.

In the flip-flop circuit FFn having this structure, when the transfer control signal TRS is "0" level and the signal/TRS is "1" level, the transfer gate 35 is conductive and the transfer gate 39 is non-conductive. The flip-flop circuit FFn operates as a latch circuit of master slave type having an input terminal Din2 and synchronizing with the clock signals CLK and /CLK. That is, when the CLK is "0" level, the clocked inverters 31 and 37 are active and the clocked inverters 33 and 34 are inactive. In addition, the signal of the output terminal Q (/Q) is held and the signal supplied to the second input terminal Din2 is transferred to the input terminal of the clocked inverter 34. When the next CLK is "1" level, the clocked inverters 33 and 34 are active and the clocked inverters 31 and 37 are inactive. The next signal which has been previously transferred to the input terminal of the clocked inverter 34, is transferred to the output terminal Q (/Q).

When the transfer control signal TRS is "1" level and the signal /TRS is "0" level, the transfer gate 39 is conductive and the transfer gate 35 is non-conductive. The input terminal in this case is therefore Din1.

Figure 7:
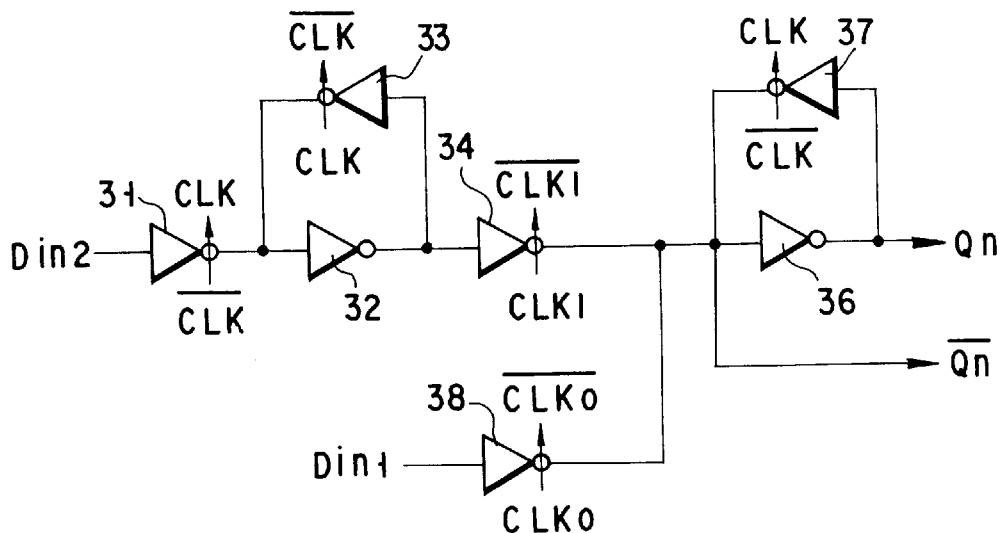
FIG. 7 is a circuit diagram showing another example of a flip-flop circuit within the burst counter of FIG. 5.

FIG. 7 shows another example of the detailed circuit arrangement of the flip-flop circuit of FIG. 5. The flip-flop circuit of FIG. 7 is the same as that of FIG. 6 except that the transfer gates 35 and 37 are not provided, clock signals CLK1 and /CLK instead of the clock signals CLK and /CLK1 control the operation of the clocked inverter 34 and that clock signals CLK0 and /CLK0 instead of the clock signals CLK and /CLK control the operation of the clocked inverter 38.

In this case, the clocked inverter 34 has the same functions as that of the clocked inverter 34 and that of the transfer gate 35 shown in FIG. 6, and the clocked inverter 38 has the same functions as that of the clocked inverter 38 and that of the transfer gate 39 shown in FIG. 6. Due to this, the new clock signals CLK1, /CLK1 and CLK0, /CLK0 are employed.

These clock signals CLK1, /CLK1 and CLK0, /CLK0 are generated by a control signal generating circuit shown in FIG. B inputting the transfer control signal TRS and the clock signals CLK, /CLK.

The control signal generating circuit comprises two NAND gate circuits 41 and 42, and five inverters 43 to 47. The clock signal CLK is supplied to an inverter 43, NAND gate circuits 41 and 42. The output signal of the inverter 43 is fed to the circuit of FIG. 7 as the clock signal /CLK and to an inverter 44. The output signal of the inverter 44 is fed to the circuit of FIG. 7 as the clock signal CLK.

The transfer control signal TRS is supplied to the NAND gate circuit 41 and to the NAND gate circuit 42 through the inverter 46. The output signal of the NAND circuit 41 is fed to the circuit of FIG. 7 as the clock signal /CKL0 and to an inverter 45. The output signal of the inverter 45 is fed to the circuit of FIG. 7 as the clock signal CLK0. The output signal of the NAND gate circuit 42 is fed to the circuit of FIG. 7 as the clock signal /CLK1 and to an inverter 47. The output signal of the inverter 47 is fed to the circuit of FIG. 7 as the clock signal CLK1.

Figure 8:
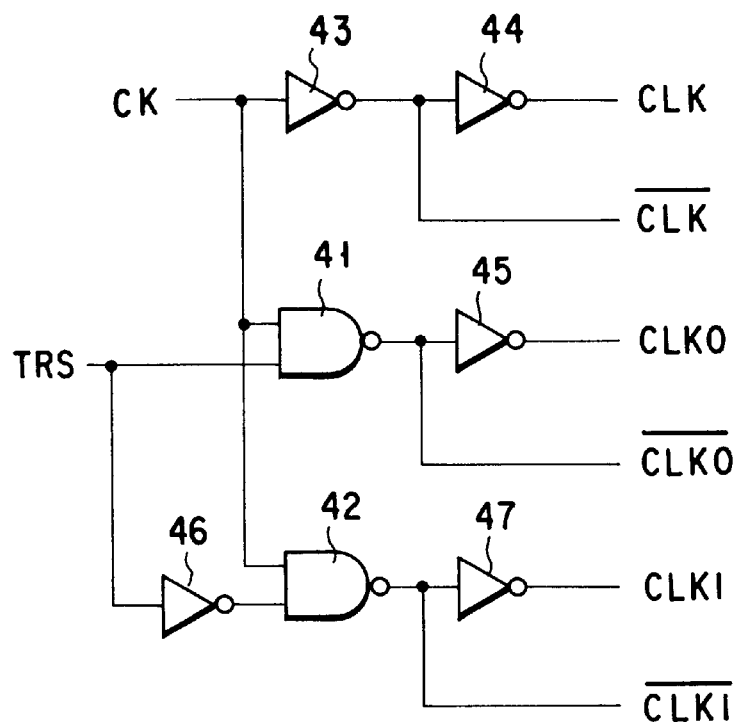
FIG. 8 is a circuit diagram showing the structure of a circuit generating a clock signal for controlling the flip-flop circuit of FIG. 7.

In the control signal generating circuit of FIG. 8 having this structure, when the transfer control signal TRS is "1" level, the output signal of the inverter 46 is "0" level and the output signal (/CLK1) or the NAND gate circuit 42 is always "1" level. As a result, the clock signal CLK1 obtained as the output signal of the inverter 47 is always "0" level irrespectively of the level of the input clock signal CLK. By contrast, the output signal (/CLK0) of the NAND gate circuit 41 changes in accordance with the level of the input clock signal CLK and the output signal CLK0 of the inverter 45 is a inverted level. As a result, when the transfer control signal TRS is "1" level, the clocked inverter 38 operates synchronously with the input clock signal and the clocked inverter 34 is in a non-operation state in the circuit of FTG. 7.

When the transfer control signal TRS is "0" level, contrary to the above, the clocked inverter 34 operates synchronously with the input clock signal and the clocked inverter 38 is in a non-operation state in the circuit of FIG. 7.

Figure 9:
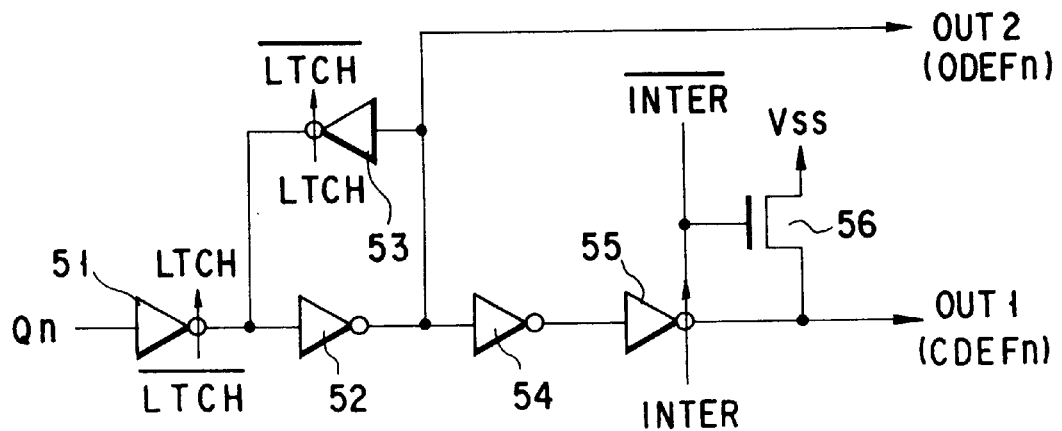
FIG. 9 is a circuit diagram showing an example of a latch circuit within the burst counter of FIG. 5.

FIG. 9 shows an example of the detailed circuit arrangement of the latch circuit Ln of FIG. 5. The signal supplied to the input terminal Qn is supplied to a clocked inverter 51. The clocked inverter 51 operates and inverts an input when the latch control signal LTCH is "0" level and the signal /LTCH complementary to LTCH is , "1" level. The output of the clocked inverter 51 is supplied to an inverter 52. The output of the inverter 52 is supplied to a clocked inverter 53 and to an inverter 54. The clocked inverter 53 operates and inverts an input when the control signal LTCH is "1" level and the signal /LTCH is "0" level. The output of the inverter 53 is returned to the input terminal of the inverter 52. The output of the inverter 54 is supplied to a clocked inverter 55. The clocked inverter 55 operates and inverts an input when the control signal INTER is "1" level and the signal /INTER complementary to the signal INTER is "0" level. The output OUT1 of the clocked inverter 55 becomes one of the latch signals CDEFn. The output OUT2 of the inverter 52 becomes the other latch signal ODEFn.

An N-channel MOS transistor 56 is connected between the output OUT1 and the ground potential VSS. The signal /INTER is supplied to the gate of the transistor 56. The transistor 56 is conductive when the signal /INTER is "1" level, that is, when the clocked inverter 55 is in an inactive state. The transistor 56 sets the logic level of one latch signal CDEFn at "0" level irrespectively of the signal level of the input terminal Qn.

Figure 10:
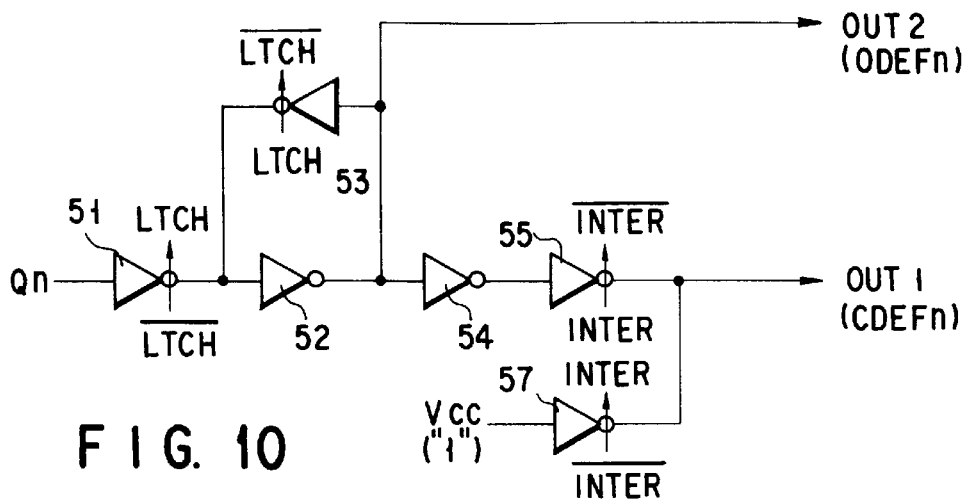
FIG. 10 is a circuit diagram showing a different example of a latch circuit within the burst counter of FIG. 5.
Figure 11:
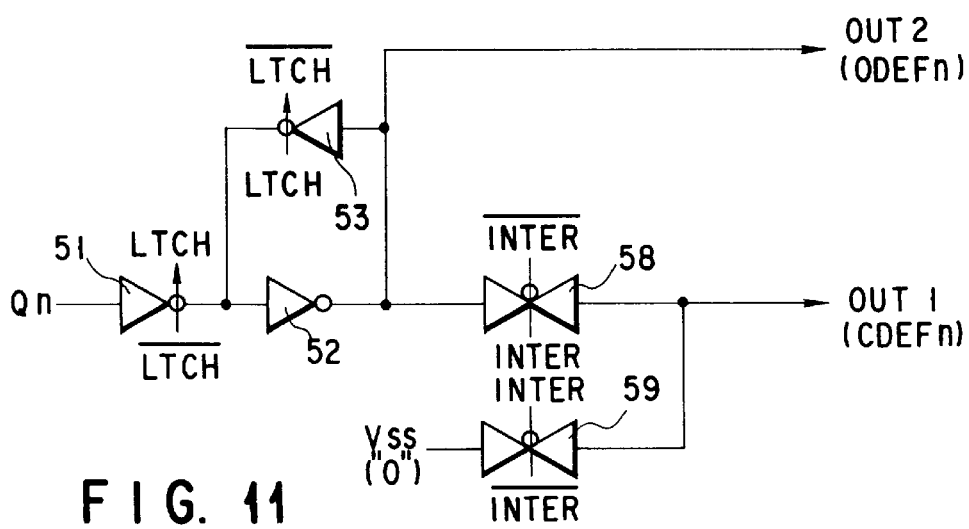
FIG. 11 is a circuit diagram showing another example of a latch circuit within the burst counter of FIG. 5.
Figure 12:
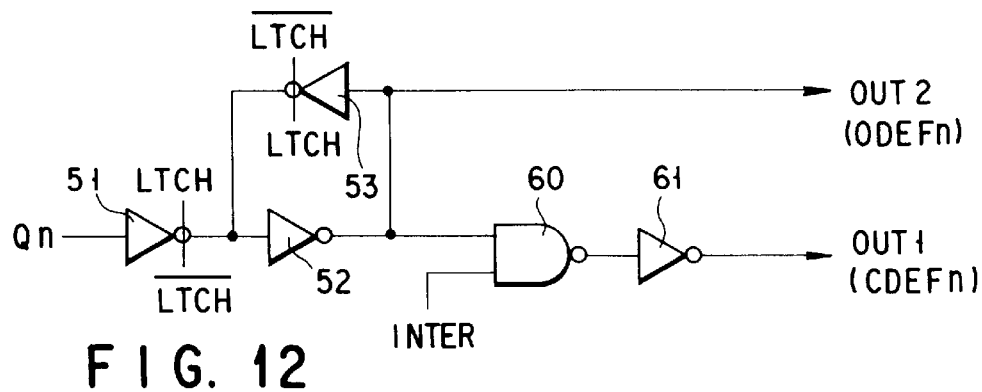
FIG. 12 is a circuit diagram showing yet another example of a latch circuit within the burst counter of FIG. 5.

FIGS. 10 through 12 show examples of the detailed circuit arrangement of the latch circuit Ln of FIG. 5 different from that of FIG. 9, respectively.

In FIG. 10, a clocked inverter 57 instead of the transistor 56 of FIG. 9 is provided and the power supply potential VCC ("1") is supplied to the input terminal or the clocked inverter 57. The output terminal of the clocked inverter 57 is connected to an output OUT1. The clocked inverter 57 inputs the control signals INTER and /INTER in different position from those of the clocked inverter 55 so as to operate in an opposite phase to that of the clocked inverter 55.

In FIG. 11, instead of the inverter 54, the clocked inverter 55 and the transistor 56 of FIG. 9, a transfer gate 58 is connected between the inverter 52 and the output OUT1 and a transfer gate 59 is connected bet-ween the ground potential VSS ("0") and the output OUT1. The transfer gates 58 and 59 input control signals INTER and /INTER in different positions from each other so as to operate in phases opposite each other.

In FIG. 12, instead of the inverter 54, the clocked inverter 55 and the transistor 56 of FIG, 9, an NAND gate circuit 60 and an inverter 61 are provided. The output signal of the inverter 52 and the control signal INTER are inputted into the NAND gate circuit 60. The output signal of the NAND gate circuit 60 is inputted into the inverted 61. The output terminal of the inverter 61 is connected to the output OUT1.

The latch circuits Ln shown in FIGS. 9 through 12 can obtain the same output signals.

Figure 13A:
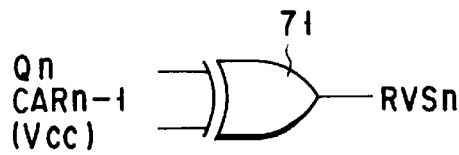
FIGS. 13A and 13B are circuit diagrams showing an example of the detailed structure of the first logic circuit within the burst counter of FIG. 5.
Figure 13B:
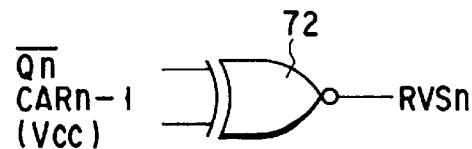

FIGS. 13A and 13B show examples of detailed circuit arrangement of the first logic circuit An of FIG. 5, respectively.

The first logic circuit An of FIG. 13A comprises an Exclusive-OR gate circuit 71. The output Qn of the corresponding n-th bit flip-flop circuit FFn and a carry signal CARn-1 (or VCC) outputted from the less significant bit-side second logic circuit Bn-1 are supplied to the Exclusive-OR gate 71.

The first logic circuit An of FIG. 13B comprises an Exclusive-NOR gate circuit 72. An inverted output /QN of the corresponding n-th bit flip-flop circuit FFn and a carry signal CARn-1 (or VCC) outputted from the less significant bit-side second logic circuit Bn-1 are supplied to the Exclusive-NOR gate circuit 72.

Each of the first logic circuits as shown in FIGS. 13A and 13B inputs a signal RVSn at "0" level when the two input signals Qn (or /Qn) and CARn-1 differ from each other in logic level state, and outputs the signal RVSn at "1" level when the input signals Qn (or /Qn) and CARn-1 are equal to each other in logic level state.

Figure 14A:
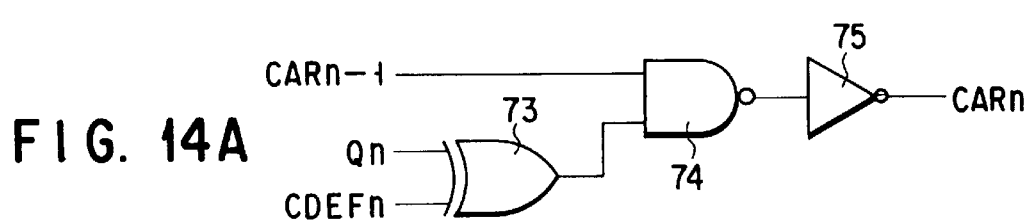
FIGS. 14A and 14B are circuit diagrams showing an example of the detailed structure of the second logic circuit within the burst counter of FIG. 5.
Figure 14B:
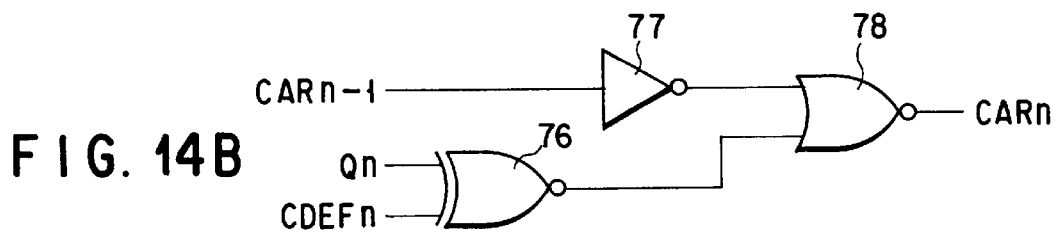

FIGS. 14A and 14B show examples of the detailed circuit arrangement of the second logic circuit Bn of FIG. 5, respectively.

The second logic circuit Bn shown in FIG. 14A comprises an Exclusive-OR gate circuit 73 supplied with an output Qn of the corresponding n-th bit flip-flop circuit FFn and one of the latch signals CDEFn outputted from the latch circuit Ln, an NAND gate circuit 74 supplied with the output of the Exclusive-OR gate circuit 73 and a carry signal CARn-1 from the less significant bit side and an inverter 75 inverting the output of the NAND gate circuit 74. A carry signal CARn to be supplied to the more significant bit side is outputted from the inverter 75.

The second logic circuit Bn shown in FIG. 14B comprises an Exclusive-NOR gate circuit 76 supplied with an output Qn of the corresponding n-th bit flip-flop circuit FFn and one of the latch signals CEDFn outputted from the latch circuit Ln, an inverter 77 inverting the less significant bit-side carry signal CARn-1, and an NOR gate circuit 78 supplied with the output of the inverter 77 and the output of the Exclusive-NOR gate circuit 76. A carry signal CARn to be supplied to the more significant bit side is outputted from the NOR gate circuit 76.

Each of the second logic circuits shown in FIGS. 14A and 14B outputs a carry signal CARn at "1" level only when the input signals Qn and CDEFn differ from each other in logic level state and the signal CARn-1 is "1" level, and otherwise outputs a carry signal CARn at "0" level, as shown in FIG. 16.

Figure 15A:
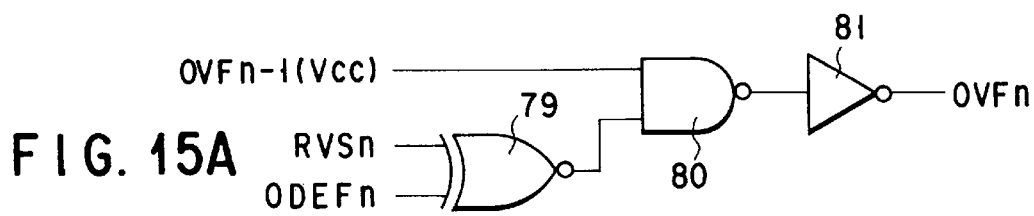
FIGS. 15A and 15B are circuit diagrams showing an example of the third structure of the third logic circuit within the burst counter of FIG. 5.
Figure 15B:
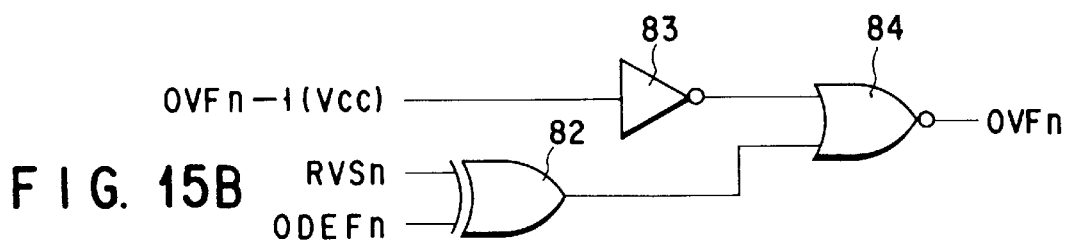

FIGS. 15A and 15B show examples of the detailed circuit arrangement of the third logic circuit Cn of FIG. 5, respectively.

The third logic circuit Bn shown in FIG. 15A comprises an Exclusive-NOR gate circuit 79 supplied with an output RVSn of the corresponding n-th bit first logic circuit An and the other latch signal ODEFn outputted from the latch circuit Ln, an NAND gate circuit 80 supplied with the output of the Exclusive-NOR gate circuit 79 and an overflow signal OVFn-1 from the less significant bit side, and an inverter 81 inverting the output of the NAND gate circuit 80. An overflow signal OVFn to be supplied to the more significant bit side is outputted from the inverter 81.

The second logic circuit Bn shown in FIG. 15B comprises an Exclusive-OR gate circuit 82 supplied with the output RVSn of the corresponding n-th bit first logic circuit An and the other latch signal ODEFn outputted from the latch circuit Ln, an inverter 83 inverting an overflow signal OVFn-1 from the less significant bit side, and an NOR gate circuit 84 supplied with the output of the inverter 83 and the output of the Exclusive-NOR gate circuit 82. An overflow en signal OVFn to be supplied to the more significant bit side is outputted from the NOR gate circuit 84.

Each of the third logic circuits Cn shown in FIGS. 15A and 15B outputs an overflow signal OVFn at "1" level to the more significant bit side only when the input signals RVSn and ODEFn are equal to each other in logic level state and the overflow signal OVFn-1 from the less significant bit side is "1" level, and otherwise outputs an overflow signal OVFn at "0" level to the more significant bit side.

The operation of the column counter having the above structure will be described with reference to the timing chart of FIG. 18. First, the operation of the column counter when an operation mode is set to interleave sequence.

In the burst mode, after the address buffer 17 of FIG. 4 takes in first column address signals, those of the less significant three bits are supplied to the first input terminals Din1 of the flip-flop circuits FF1 to FF3 as the CA1 to CA3. In a clock cycle 1, when the internal clock signal CLK is "1" level, the clock signal /CLK is "0" level, the transfer control signal TRS is "1" level and the transfer control signal /TRS is "0" level, the transfer gate 39 within the flip-flop circuit FFn shown in, for example, FIG. 6 is conductive. Then, the signal supplied to the input terminal Din1 is transferred to the input terminal of the inverter 36 through the clocked inverter 38 and the transfer gate 39. The transferred signal is inverted by the inverter 36 and outputted as Qn. Next, when the internal clock signal CLK is "0" level and the clock signal /CLK, is "1" level, the clocked inverter 37 of FIG. 6 is conductive. Then, the signal previously transferred to the input terminal of the inverter 36 is latched by the inverter 36 and the clocked inverter 37. In this case, the column address signal of the three bits supplied from the address buffer 17 are CA1="0", CA2="1" and CA3="1" which amounts to "6" if represented based on the decimal notation count number. After the address buffer 17 takes in the column address signals, the transfer control signal TRS becomes "0" level and the transfer control gate /TRS becomes "1" level.

Meanwhile, in the latch circuit Ln shown in, for example, FIG. 9, when the column addresses are generated, the latch control signal LTCH is "0" level and the latch control signal /LTCH is "1" level in clock cycle 1. LTCH is kept "1" level and /LTCH is kept "0" level in the following clock cycles. Therefore, when the column address signals are generated, in the clock cycle 1, the clocked inverter 51 shown in FIG. 9 is activated. In the following clock cycles, the clocked inverter 53 is activated and the count signal Qn taken in by the clocked inverter 51 continues to be latched by the inverter 52 and the clocked inverter 53. Here, the operation mode is set to the interleave sequence and the signal INTER is "1" level and the signal /INTER is "0" level. Accordingly, the clocked inverter 55 is activated and the MOS transistor 56 is turned off. Therefore, two kinds of latch signals CDEFn and ODEFn outputted from the latch circuit Ln are set at the same logic level as that of the count signal Qn in the clock cycle 1.

Now, the operation of each bit in the first half of the clock cycle 1, that is, when the internal clock signal CLK is "1" level will be descried.

As regards the first bit, in the first logic circuit A1, the signal Q1 is "0" level and VCC corresponding to the carry signal CAR is "1" level. The output signal RVS1 of the first logic circuit A1 is "1" level. In the second logic circuit B1, the signal Q1 is "0" level, the latch signal CDEF1 is "0" level like Q1 and VCC corresponding to the carry signal CAR is "1" level. The carry signal CAR 1 outputted from the second logic circuit B1 is "0" level. In the third logic circuit C1, the signal RVS1 is "1" level, the latch signal ODEF1 is "0" level like RVS1 and VCC corresponding to the overflow signal OVF is "1" level. The overflow signal OVF1 outputted from the third logic circuit C1 is "0" level.

As regards the second bit, the signal Q2 is "1" level, two latch signals CDEF1 and ODEF2 outputted from the latch circuit L2 are "1" level, the carry signal CAR1 from the less significant bit side is "0" level and the overflow signal OVF1 from the less significant bit side is "0" level. The output signal RVS2 of the first logic circuit A2 is "1" level, the carry signal CAR2 outputted from the second logic circuit B2 is "0" level and the overflow signal OVF2 outputted from the third logic circuit C2 is "0" level.

As regards the third bit, the signal Q3 is "1" level, two latch signals CDEF1 and ODEF2 outputted from the latch circuit L3 are "1" level, the carry signal CAR2 from the less significant bit side is "0" level and the overflow signal OVF2 from the less significant bit side is "0" level. The output signal RVS3 of the first logic circuit A3 is "1" level, the carry signal CAR3 outputted from the second logic circuit B3 is "0" level and the overflow signal OVF3 outputted from the third logic circuit C3 is "0" level.

Meanwhile, when column address signals are generated in the second half of the clock cycle 1, that is, when the internal clock signal CLK is "0" level, in the flip-flop circuit FFn (e.g. the flip-flop circuit of FIG. 6), the clocked inverter 31 is activate and the signal RVSn formed by the first logic circuit An is transferred to the input terminal of the clocked inverter 34 through the clocked inverter 31 and the inverter 32. When the clock signal CLK turns to "1" level in the clock cycle 2, the clocked inverter 34 is activate and inverts an input. When the clocked inverter 34 is activate, the transfer control signal TRS it "0" level and the transfer control signal /TRS is "1" level, whereby the transfer gate 35 is now conductive.

As a result, in the first bit, the output RVS1 of the first logic circuit A1 is "1" level in the first half of the clock cycle 2. When the clocked inverter 31 within the flip-flop circuit FF1 is activate, the signal of the input terminal of the clocked inverter 34 is "1" level. When the clocked inverter 34 is activate, the output is inverted to "0" level and the count output Q1 is inverted from "0" level to "1" level. Accordingly, in the first bit, the output RVS1 of the first logic circuit A1 is inverted to "0" level, the carry output CAR1 from the second logic circuit B1 is inverted to "1" level and the overflow signal OVF1 from the third logic circuit C1 is inverted to "1" level.

Likewise, in the second bit, the output RVS2 of the first logic circuit A2 is "1" level in the first half of the clock cycle 2. When the clocked inverter 31 within the flip-flop circuit FF2 is activated the signal of the input terminal of the clocked inverter 34 is "1" level, When the clocked inverter 34 is then activate, the output is inverted to "0" level and the count output Q2 remains "1" level. Accordingly, in the second bit, the output RVS2 of the first logic circuit A2 is inverted to "0" level the carry output CAR2 from the second logic circuit B2 remains "0" level and the overflow signal OVF1 from the third logic circuit C2 remains "0" level.

In the third bit, the output RVS3 of the first logic circuit A3 is "1" level in the first half of the cycle 2. When the clocked inverter 31 within the flip-flop circuit FF3 is activated, the signal of the input terminal of the clocked inverter 34 is "1" level. When the clocked inverter 34 is then activated, the output is inverted to "0" level and the count output Q3 remains "1" level. Accordingly, in the third bit, the output RVS3 of the first logic circuit A3 remains "0" level, the carry output CAR3 from the second logic circuit B3 remains "0" level and the overflow signal OVF1 from the third logic circuit C3 remains "0", level.

Thereafter, in the second half of the clock cycle 2, the clock signal CLK is inverted to "0" level, whereby the clocked inverters within the flip-flop circuits FFn of respective bits are activated and the respective count outputs Q1 to Q3 are latched by latch circuits consisting of the clocked inverters 37 and the inverters 36, respectively. While the latch operation is conducted, the count outputs Q1 to Q3 of the three bits by the flip-flop circuits FF1 to FF3 are Q1="1", Q2="1" and Q3="1", respectively which amount to "7"if represented based on the decimal notation count number.

Likewise, in clock cycles 3, 4 . . . , the count outputs Q1 to Q3 of three bits by the flip-flop circuits FF1 to FF3 change as follows:

Q1="0", Q2="0", Q3="1" ("4" represented based on the decimal notation count number);

Q1="1", Q2="0", Q3="1" ("5" represented based on the decimal notation count number);

Q1="0", Q2="1", Q3="0" ("2" represented based on the decimal notation count number);

Q1="1", Q2="1", Q3="0" ("3" represented based on the decimal notation count number);

Q1="0", Q2="0", Q3="0" ("0" represented based on the decimal notation count number);

Q1="1", Q2="0", Q3="0" ("1" represented based on the decimal notation count number); and Q1="0", Q2="1", Q3="1" ("6" represented based on the decimal notation count number).

Figure 18:
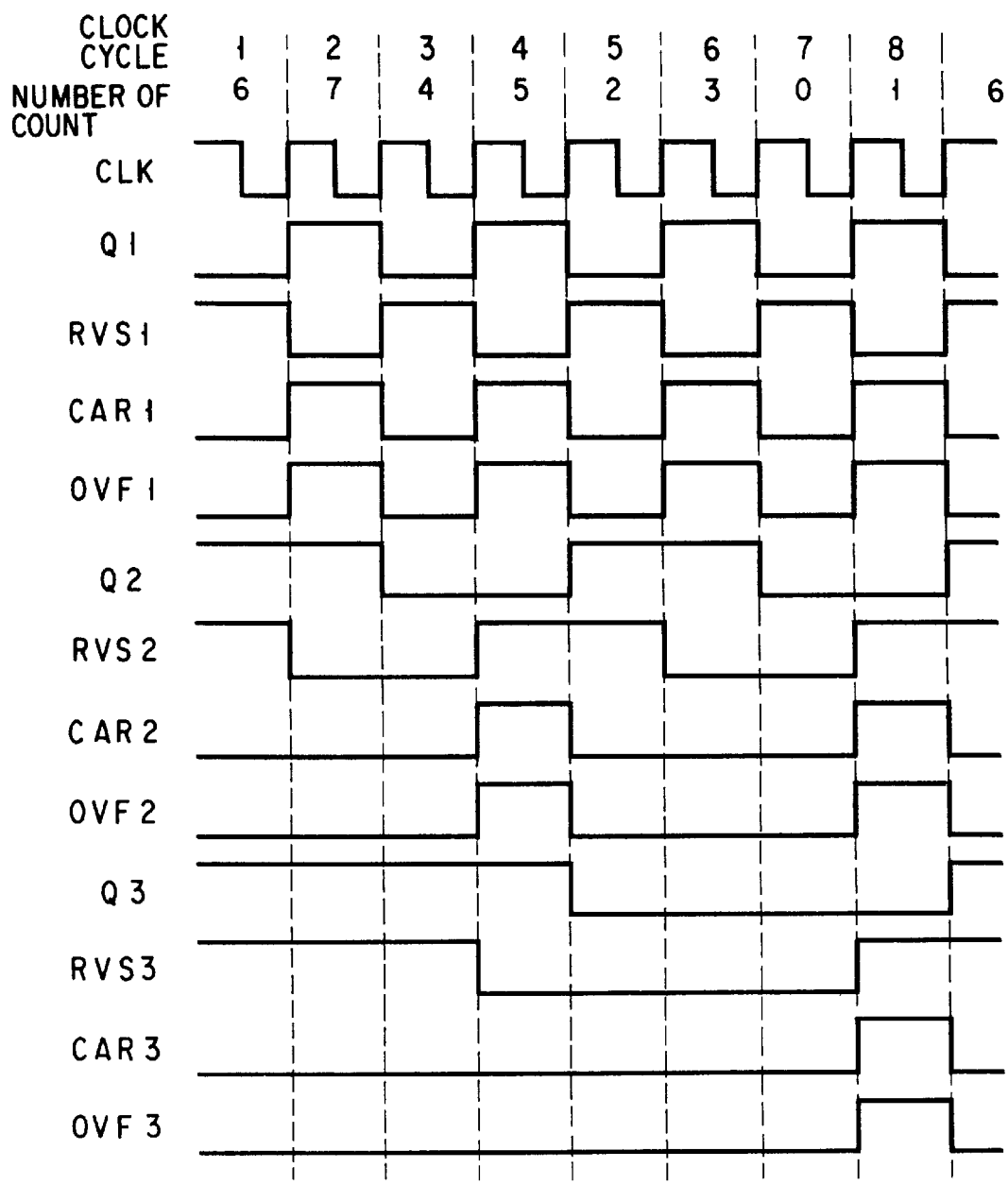
FIG. 18 is a timing chart showing an example of the operation of the burst counter of FIG. 5 in the interleave sequence.

As shown in the timing chart of FIG. 18, the count number changes from "6" to "7" to "4" to "5" to "2" to "3" to "0" to "1" to "6" in this order. This means that the burst counter operates in the interleave sequence.

The period from "6" to "1" of the count number is one cycle (burst length of 8) of the column counter. After counting the clock signal of one cycle, the overflow signal OVF3 outputted from the third bit, third logic circuit C3 turns to "1" level. In other words, the overflow signal OVF3 indicates a state that the count number of the column counter reaches a predetermined value. When the signal OVF3 is found to be at "1" level, the burst operation is terminated, or the next external address is fetched.

Next, the operation of the column counter when the operation mode is set to linear sequence will be described with reference to the timing chart of FIG. 19. In this case, the less significant three bits of column address signals first received by the address buffer 17 are CA1=CA2=CA3="0" which are "0" if represented based on the decimal notation count number. The column address signals of the three bits are supplied to first input terminals Din1 of the flip-flop circuits FF1 to FF3, respectively. As in the above-described case, when the internal clock signal CLK is "1" level and the clock signal /CLK is "0" level in the first half of the clock cycle 1, the column address signals of the three bits are transferred to the input terminals of the inverters 36 through the clocked inverters 38 and the transfer gates 39 of FIG. 6, respectively. They are inverted by the respective inverters 36 and outputted as Qn. When the internal clock signal CLK is "0" level and the clock signal /CLK is "1" level in the second half of the clock cycle 1, the clocked inverter 37 of FIG. 6 is conductive and the signal previously transferred to the input terminal of the inverter 36 is latched by the inverter 36 and the clocked inverter 37. In this case, Q1=Q2=Q3="0" as shown in FIG. 9.

In the latch circuit Ln shown in, for example, FIG. 9, when a column address is generated, the latch control signal LTCH is "0" level and /LTCH is "1" level in the clock cycle 1 and, in the following clock cycles, LTCH is kept "1" level and /LTCH is kept "0" level. Therefore, in the clock cycle 1, the clocked inverter 51 shown in FIG. 9 is activated and, in the following clock cycles, the clocked inverter 53 is activated and thereby the count signal Qn taken in by the clocked inverter 51 continues to be latched by the inverter 52 and the clocked inverter 53. Thus, one of the two latch signals ODEFn outputted from the latch circuit Ln of each of the first to third bits is set to "0" level in accordance with the input signal Qn in the clock cycle 1.

Here, the operation mode is set to linear sequence, the signal INTER is "0" level and the signal /INTER is "1" level. Due to this, the clocked inverter 55 is inactive and the transistor 56 is turned on. Thus, the other latch signal CDEFN outputted from the latch circuit Ln of each of the first to third bits is set to "0" level by the transistor 56 which is now turned on.

The bit operation in the clock cycle 1 will be described.

As regard the first bit, in the first logic circuit A1, the signal Q1 is "0" level and VCC corresponding to the carry signal CAR is "1" level. The output signal RVS1 of the first logic circuit A1 is "1" level. In the second logic circuit B2, the signal Q1 is "0" level, the latch signal CDEF1 is "0" level and VCC corresponding to the carry signal CAR is "1" level. The carry signal CAR1 outputted from the second logic circuit B1 is "0" level. In the third logic circuit C1, the signal RVS1 is "1" level, the latch signal ODEF1 is "0" level and VCC corresponding to the overflow signal OVF is "1" level. The overflow signal OVF1 outputted from the third logic circuit C1 is "0" level.

As regards the second bit, the signal Q2 is "0" level, the two latch signals CDEF1 and ODEF2 outputted from the latch circuit L2 are "0" level, the carry signal CAR1 from the less significant bit side is "0" level and the overflow signal OVF1 from the less significant bit side is "0" level. The output signal RVS2 of the first logic circuit A2 is "0" level, the carry signal CAR2 outputted from the second logic circuit B2 is "0" level and the overflow signal OVF2 outputted from the third logic circuit C2 is "0" level.

As regard the third bit, the signal Q3 is "0" level, two latch signals CDEF1 and ODEF2 outputted from the latch circuit L3 are "0" level, the carry signal CAR2 from the less significant bit side is "0" level and the overflow signal OVF2 from the less significant bit side is "0" level, The output signal RVS3 of the first logic circuit A3 is "0" level, the carry signal CAR3 outputted from the second logic circuit B3 is "0" level and the overflow signal OVF3 outputted from the third logic circuit C3 is "0" level.

In the second halt of the clock cycle 1, that is, when the internal clock signal CLK is "0" level, the clocked inverter 31 of each bit is activated in the flip-flop circuit FFn. The signal RVSn formed by the first logic circuit An is transferred to the input terminal of the clocked inverter 34 through the clocked inverter 31 and the inverter 32. In the clock cycle 2, when the clock signal CLK turns to "1" level, the clocked inverter 34 is activated and inverts an input. When the clocked inverter 34 is activated, the transfer control signal TRS is "0" level and the signal /TRS is "1" level and then the transfer gate 35 becomes conductive.

As a result, in the first half of the clock cycle 2, in the first bit, the output RVS1 of the first logic circuit A1 is "1" level. When the clocked inverter 31 within the flip-flop circuit FF1 is activated, the signal of the input terminal of the clocked inverter 34 is "1" level. When the clocked inverter 34 is activated, the output is inverted to "0" level and the count output Q1 is inverted to "1" level. Accordingly, in tho first bit, the output RVS1 of the first logic circuit A is inverted to "0" level, the carry output CAR1 from the second logic circuit B1 is inverted to "1" level and the overflow signal OVF1 from the third logic circuit C1 is inverted to "1" level.

Likewise, in the first half of the clock cycle 2, in the second bit, the output RVS2 of the first logic circuit A2 is "0" level. When the clocked inverter 31 within the flip-flop circuit FF2 is activated, the signal of the input terminal of the clocked inverter 34 is "0" level. When the clocked inverter 34 is then activated, the output is inverted to "1" level and thereby the count output Q2 remains "0" level. Accordingly, the output RVS2 of the first logic circuit A2 is inverted to "1" level, the carry output CAR2 from the second logic circuit B2 remains "0" level and the overflow signal OVF1 from the third logic circuit C2 remains "0" level.

Furthermore, in the first half of the clock cycle 3, in the third bit, the output RVS3 of the first logic circuit A3 is "0" level. When the clocked inverter 31 within the flip-flop circuit FF3 is activated, the signal of the input terminal of the clocked inverter 34 is "0" level. When the clocked inverter 34 is then activated, the output is inverted to "1" level and thereby the count output Q3 remains "0" level. The output RVS3 of the first logic circuit A3 remains "0" level, the carry output CAR3 from the second logic circuit B3 remains "0" level and the overflow signal OVF1 from the third logic circuit C3 remains "0" level.

Thereafter, in the second half of the clock cycle 2, the internal clock signal CLK is inverted to "0" level, whereby the clocked inverters 37 within the flip-flop circuits FFn of respective bits are activated and the count outputs Q1 to Q3 are latched by latch circuits consisting of the clocked inverters 37 and the inverters 36, respectively. While the latch operation is conducted, the count outputs Q1 to Q3 of the three bits by the flip-flop circuits FF1 to FF3 are Q1="1", Q2="0" and Q3="0" which amounts to "1" if represented based on the decimal notation count number.

In the second half of the clock cycle 2, that is, when the internal clock signal CLK is "0" level, the clocked inverter 31 is activated in the flip-flop circuit FFn and the signal RVSn formed by the first logic circuit An is transferred to the input terminal of the clocked inverter 34 through the clocked inverter 31 and the inverter 32. When the clock signal CLK turns to "1" level in the clock cycle 2, the clocked inverter 34 is activated and inverts an input.

As a result, in the first half of the clock cycle 3, in the first bit, the output RVS1 of the first logic circuit A1 is "0" level. When the clocked inverter 31 within the flip-flop circuit FF1 is activated, the signal of the input terminal of the clocked inverter 34 is "0" level. When the clocked inverter 34 is then activated, the output of the clocked inverter 34 is inverted to "1" level and the count output Q1 is inverted to "0" level again. Accordingly, in the first bit, the output RS1 of the first logic circuit A1 is inverted to "1" level, the carry output CAR1 from the second logic circuit B1 is inverted to "0" level and the overflow signal OVF1 from the second logic circuit B1 is inverted to "0" level.

Likewise, in the first half of the clock cycle 3, in the second bit, the output RVS2 of the first logic circuit A2 is "1" level. When the clocked inverter 31 within the flip-flop circuit FF2 is activated, the signal of the input terminal of the clocked inverter 34 is "1" level. When the clocked inverter 34 is then activated, the output of the clocked inverter 34 is inverted to "0" level and the count output Q2 is inverted to "1" level. The output RVS2 of the first logic circuit A2 remains "1" level, the carry output CAR2 from the second logic circuit B2 remains "0" level and the overflow signal OVF1 from the third logic circuit C2 remains "0" level.

Further, in the first half of the clock cycle 3, in the third bit, the output RVS3 of the first logic circuit A3 is "0" level. When the clocked inverter 31 within the flip-flop circuit FF3 is activated, the signal of the input terminal of the clocked inverter 34 is "1" level. When the clocked inverter 34 is then activated, the output of the clocked inverter 34 is inverted to "0" level and the count output Q3 thereby remains "0" level. The output RVS3 of the first logic circuit A3 remains "0" level, the carry output CAR3 from the second logic circuit B3 remains "0" level and the overflow signal OVF1 from the third logic circuit remains "0" level.

Thereafter, in the second half of the clock cycle 3, the internal clock signal CLK is inverted to "0" level, whereby the clocked inverters 37 within the flip-flop circuits FFn of respective bits are activated and the count outputs Q1 to Q3 are latched by latch circuits consisting of the clocked inverters 37 and the inverters 36, respectively. While the latch operation is conducted, the count outputs of the three bits Q1 to Q3 by the flip-flop circuits FF1 to FF3 are Q1="0", Q2="1" and Q3="0" which amount to "2" if represented based on the decimal notation count number.

In the first half of the clock cycle 4, in the first bit, the output RVS1 of the first logic circuit A1 is "1" level. When the clocked inverter 31 within the flip-flop circuit FF1 is activated, the signal of the input terminal of the clocked inverter 34 is "1" level. When the clocked inverter 34 is then activated, the output of the clocked inverter 34 is inverted to "0" level and the count output Q1 is inverted to "1" level again. Accordingly, in the first bit, the output RVS1 of the first logic circuit A1 is inverted to "1" level, the carry output CAR1 from the second logic circuit B1 is inverted to "1" level and the overflow signal OVF1 from the third logic circuit C1 is inverted to "1" level.

Likewise, in the first half of the clock cycle 4, in the second bit, the output RVS2 of the first logic circuit A2 is "1" level. When the clocked inverter 31 within the flip-flop circuit FF2 is activated, the signal of the input terminal of the clocked inverter 34 is "1" level. When the clocked inverter 34 is then activated, the output of the clocked inverter 34 is inverted to "0" level and the count output Q2 thereby remains "1" level. Accordingly, the output RVS2 of the first logic circuit A2 is inverted to "0" level, the carry output CAR2 from the second logic circuit B2 is inverted to "1" level and the overflow signal OVF1 from the third logic circuit C2 remains "0" level.

Furthermore, in the first half of the clock cycle 4, in the third bit, the output RVS3 of the first logic circuit A3 is "0" level. When the clocked inverter 31 within the flip-flop circuit FF3 is activated, the signal of the input terminal of the clocked inverter 34 is "0" level. When the clocked inverter 34 is then activated, the output of the clocked inverter 34 is inverted to "1" level and the count output Q3 is thereby inverted to "1" level. Accordingly, the output RVS3 of the first logic circuit A3 remains "0" level, the carry output CAR3 from the second logic circuit B3 remains "0" level and the overflow signal from the third logic circuit C3 remains "0" level.

Thereafter, in the second half of the clock cycle 4, the internal clock signal CLK is inverted to "0" level, whereby the clocked inverters 37 within the flip-flop circuits FFn of respective bits are activated and the count outputs Q1 to Q3 are latched by latch circuits consisting of the clocked inverters 37 and the inverters 36, respectively. While the latch operation is conducted, the count outputs of the three bits Q1 to Q3 by the flip-flop circuits FF1 to FF3 are Q1="1", Q2="1" and Q3="0" which amount to "3" if represented based on the decimal notation count number.

As in the same manner as described above, in clock cycles 5, 6, . . . , the count outputs of the three bits Q1 to Q3 by the flip-flop circuits PF1 to FF3 change as follows:

Q1="0", Q2="0", Q3="1" ("4" represented based on the decimal notation count number);

Q1="1", Q2="0", Q3="1" ("5" represented based on the decimal notation count number);

Q1="0", Q2="1", Q3="1" ("6" represented based on the decimal notation count number);

Q1="1", Q2="1", Q3="1" ("7" represented based on the decimal notation count number); and Q1="0", Q2="0", Q3="0" ("0" represented based on the decimal notation count number).

In this case, as shown in the timing chart of FIG. 19, the count number changes from "0" to "1" to "2" to "3" to "4" to "5" to "6" to "7" to "0" in this order. This means that the column counter operates in linear sequence.

The period from "0" to "7" of the count number is one cycle (burst length of 8) of the column counter. After counting the internal clock signal CLK of one cycle, the overflow signal OVF3 outputted from the third bit third logic circuit C3 turns to "1" level. In other words, the overflow signal OVF3 indicates a state where the count number of the column counter reaches a predetermined value. Hence, the burst operation can be terminated or the next external address can be fetched when it is detected that the signal OVF3 rises to "1" level.

As can be seen from the above description, the column counter shown in FIG. 5 operates in both the interleave sequence and the linear sequence. Compared to the conventional case where different counters dedicated to the interleave sequence and to the linear sequence, respectively are needed, the circuit arrangement according to the present invention can be simplified.

Moreover, the overflow signal OVF3 turns to "1" level every time the internal clock signal CLK is counted eight times, regardless of the sequence mode selected. It is possible to end the burst mode by detecting the signal OVF3 while the burst mode PBM is conducted. Due to this, there is no need to provide different counters as in the conventional case.

As described so far, the present invention is applicable to both the linear sequence and the interleave sequence and therefore the present invention can provide a counter circuit having a function of outputting a signal indicating that the count number reaches a predetermined optional number and can provide a semiconductor memory using the counter circuit.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A counter circuit for counting a number represented by n bits ranging from lowest to highest significance, the counter circuit comprising:

first to n-th flip-flop circuits each corresponding to a different one of the n bits, each having a first signal input terminal, a second signal input terminal and a count signal output terminal, each for receiving a synchronization signal, for receiving in a first cycle of the synchronization signal when counting starts, a first input signal inputted into said first signal input terminal and outputting an output signal in accordance with the first input signal from the count signal output terminal while the synchronization signal remains in a first logic state, for latching the output signal in accordance with said first input signal while the synchronization signal remains in a second logic state following the first logic state, for receiving, in a cycle following the first cycle of the synchronization signal after the counting starts, a second input signal inputted into said second input signal terminal while the synchronization signal remains in the first logic state, and for outputting the output signal in accordance with said second input signal from the count signal output terminal while the synchronization signal remains in the second logic state following the first logic state, thereby obtaining first to n-th bit count signals;

first to n-th latch circuits each corresponding to a different one of the n bits, each for receiving the output signal from said flip-flop circuit corresponding to the same bit, and in the first cycle of said synchronization signal when counting starts, for latching the output signal from the flip-flop circuit corresponding to the same bit and outputting first and second signals, and for setting a logic level of said second signal in accordance with a control signal irrespective of a logic level of the output signal from the flip-flop circuit corresponding to the same bit;

first to n-th, first logic circuits, each corresponding to a different one of the n bits, each for receiving the output signal from said flip-flop circuit corresponding to the same bit, each of the second to n-th, first logic circuits for receiving a carry signal, for outputting a third signal when the output signal from the flip-flop circuit corresponding to the same bit and the carry signal differ in logic level, and for feeding the third signal as said first input signal to said flip-flop circuit corresponding to the same bit; and first to n-th, second logic circuits, each corresponding to a different one of the n bits, each for receiving the output signal from said flip-flop circuit corresponding to the same bit, each of the second to n-th, second logic circuits for receiving the carry signal from one of the second logic circuits corresponding to a less significant bit and said second signal outputted from the latch circuit corresponding to the same bit, and outputting said carry signal to one of each of the first and second logic circuits corresponding to a more significant bit when the output signal from the corresponding flip-flop circuit and the second signal outputted from the latch circuit corresponding to the same bit differ from each other in logic level.

2. The counter circuit according to claim 1, wherein said first, first logic circuit is configured to receive a first predetermined voltage as an always activated carry signal, and said first, second logic circuit is configured to receive a second predetermined voltage as an always activated carry signal.

3. The counter circuit according to claim 1, further comprising first to n-th, third logic circuits each corresponding to a different one of the n bits, each for receiving said first signal from the latch circuit corresponding to the same bit, for receiving said third signal outputted from the first logic circuit corresponding to the same bit, each of the second to n-th, third logic circuits for receiving an overflow signal from one of the third logic circuits corresponding to a less significant bit, and for outputting said overflow signal to one of the third logic circuits corresponding to a more significant bit when the output signal of the corresponding flip-flop circuit and the first signal outputted from the corresponding latch circuit are equal to each other in logic level and when the overflow signal is in an active state.

4. The counter circuit according to claim 3, wherein said first, third logic circuit is configured to receive a third predetermined voltage as an always activated overflow signal.

5. The counter circuit according to claim 1, wherein each of said first to n-th flip-flop circuits comprises:

a first clocked inverter configured to be activated when said synchronization signal is in a first logic state, for inverting and then outputting said first input signal supplied to said first signal input terminal;

a first switch circuit having a first terminal connected to an output terminal of said first clocked inverter and controlled to be conductive in the first cycle of said synchronization signal when the counting starts;

a first inverter circuit having an input terminal connected to a second terminal of said first switch circuit and having an output terminal connected to said count signal output terminal of said flip-flop circuit;

a second clocked inverter having an input terminal connected to the output terminal of said first inverter circuit and configured to be activated when said synchronization signal is in the second logic state;

a third clocked inverter configured to be activated when said synchronization signal is in the second logic state, and for inverting and then outputting a second input signal supplied to said second signal input terminal;

a second inverter circuit having an input terminal connected to an output terminal of said third clocked inverter;

a fourth clocked inverter having an input terminal connected to an output terminal of said second inverter circuit and configured to be activated when said synchronization signal is in the first logic state;

a fifth clocked inverter having an input terminal connected to the output terminal of said second inverter circuit and configured to be activated when to said synchronization signal is in the first logic state; and a second switch circuit having a first terminal connected to an output terminal of said fifth clocked inverter and a second terminal connected to the input terminal of said first inverter circuit, and controlled to be continuously conductive while the synchronization signal is in the cycle following the first cycle after the counting starts.

6. The counter circuit according to claim 1, wherein each of said first to n-th flip-flop circuits comprises:

a first clocked inverter configured to be activated when the synchronization signal is in the first logic state in the first cycle when the counting starts, and for inverting and then outputting said first input signal supplied to said first signal input terminal;

a first switch circuit having a first terminal connected to an output terminal of said first clocked inverter and controlled to be conductive in the first cycle of said synchronization signal responsive to counting starting;

a first inverter circuit having an input terminal connected to a second terminal of said first switch circuit and having an output terminal connected to said count signal output terminal;

a second clocked inverter having an input terminal connected to the output terminal of said first inverter circuit and configured to be activated when said synchronization signal is in the second logic state;

a third clocked inverter configured to be activated when said synchronization signal is in the second logic state, and for inverting and then outputting the second input signal supplied to said second signal input terminal;

a second inverter circuit having an input terminal connected to an output terminal of said third clocked inverter;

a fourth clocked inverter having an input terminal connected to an output terminal of said second inverter circuit and an output terminal connected to the input terminal of said second inverter circuit, and configured to be activated when said synchronization signal is in the first logic state; and a fifth clocked inverter having an input terminal connected to the output terminal of said second inverter circuit and an output terminal connected to the input terminal of said first inverter circuit, and configured to be activated when the synchronization signal is in the first logic state in the cycle following the first cycle of said synchronization signal after the counting starts.

7. The counter circuit according to claim 1, wherein each of said first to n-th latch circuits comprises:

a sixth clocked inverter configured to be activated in the first cycle of said synchronization signal when the counting starts, and for inverting and then outputting the output signal of said flip-flop circuit corresponding to the same bit;

a third inverter circuit for receiving an output of said sixth clocked inverter and outputting said first signal;

a seventh clocked inverter having an input terminal connected to an output terminal of said third inverter circuit and an output terminal connected to an input terminal of said third inverter circuit, and configured to be activated in the cycle following the first cycle of said synchronization signal after the counting starts;

a fourth inverter circuit for receiving an output signal of said third inverter circuit;

an eighth clocked inverter for receiving an output signal of said fourth inverter circuit, and controlled to be activated in accordance with said control signal, and for outputting said second signal; and a first switch connected between an output node of said eighth clocked inverter and a node of a predetermined potential, and controlled to be conductive when said eighth clocked inverter is in an inactive state in accordance with said control signal.

8. The counter circuit according to claim 1, wherein each of said first to n-th latch circuits comprises:

a sixth clocked inverter configured to be activated in the first cycle of said synchronization signal when the counting starts, for inverting and then outputting output signal of said flip-flop circuit corresponding to the same bit;

a third inverter circuit for receiving an output of said sixth clocked inverter and outputting said first signal;

a seventh clocked inverter having an input terminal connected to an output terminal of said third inverter circuit and an output terminal connected to an input terminal of said third inverter circuit, and configured to be activated in the cycle following the first cycle of said synchronization signal after the counting starts;

a fourth inverter circuit for receiving an output signal of said third inverter circuit;

an eighth clocked inverter having an input terminal and an output terminal, for receiving an output signal of said fourth inverter circuit at said input terminal, said output terminal of said eighth clocked inverter being connected to a node carrying said second signal and being controlled to be activated in accordance with said control signal; and a ninth clocked inverter having an input terminal and an output terminal, for receiving a predetermined potential at said input terminal, said output terminal of said ninth clocked inverted being connected to a node carrying said second signal and being controlled to be activated in a manner complementary to said eighth clocked inverter in accordance with said control signal.

9. The counter circuit according to claim 1, wherein each of said first to n-th latch circuits comprises:

a sixth clocked inverter configured to be activated in the first cycle of said synchronization signal when the counting starts, for inverting and then outputting the output signal of said flip-flop circuit corresponding to the same bit;

a third inverter circuit for receiving an output of said sixth clocked inverter and outputting said first signal;

a seventh clocked inverter having an input terminal connected to an output terminal of said third inverter circuit, and an output terminal connected to an input terminal of said third inverter circuit, and configured to be activated in the cycle following the first cycle of said synchronization signal after the counting starts;

a second switch having an input terminal and an output terminal, for receiving an output signal of said third inverter circuit at said input terminal, said output terminal of said second switch being connected to a node carrying said second signal and being controlled to be conductive in accordance with said control signal; and a third switch having an input terminal and an output terminal, for receiving a predetermined potential at said input terminal, said output terminal of said third switch being connected to a node carrying said second signal and being controlled to be conductive in a manner complementary to said second switch in accordance with said control signal.

10. The counter circuit according to claim 1, wherein each of said first to n-th latch circuits comprises:

a sixth clocked inverter configured to be activated in the first cycle of said synchronization signal when the counting starts, and for inverting and then outputting the output signal of said flip-flop circuit corresponding to the same hit;

a third inverter circuit for receiving an output of said sixth clocked inverter and outputting said first signal;

a seventh clocked inverter having an input terminal connected to an output terminal of said third inverter circuit, and an output terminal connected to an input terminal of said third inverter circuit, and configured to be activated in the cycle following the first cycle of said synchronization signal after the counting starts;

a NAND gate circuit having a first input terminal, a second input terminal and an output terminal, for receiving an output signal of said third inverter circuit at said first input terminal of said NAND gate circuit and receiving said control signal at said second input terminal of said NAND gate circuit; and a fourth inverter circuit having an input terminal and an output terminal, for receiving a signal from the output terminal of said NAND gate circuit, said output terminal of said fourth inverter circuit being connected to a node carrying said second signal.

11. The counter circuit according to claim 1, wherein each of said first to n-th, first logic circuits comprises an exclusive-OR gate circuit for receiving the output signal of said flip-flop circuit corresponding to the same bit, and for receiving said carry signal from the second logic circuit corresponding to the less significant bit.

12. The counter circuit according to claim 1, wherein each of said first to n-th, first logic circuits comprises an exclusive-NOR gate circuit for receiving the output signal of said flip-flop circuit corresponding to the same bit, and for receiving said carry signal from the second logic circuit corresponding to the less significant bit.

13. The counter circuit according to claim 1, wherein each of said first to n-th, second logic circuits comprises:

an exclusive-OR gate circuit for receiving the output signal of said flip-flop circuit corresponding to the same bit, and for receiving the second signal outputted from said latch circuit corresponding to the same bit;

a NAND gate circuit for receiving said carry signal from the second logic circuit corresponding to the less significant bit, and for receiving an output signal from said exclusive-OR gate circuit; and an inverter circuit for receiving an output signal of said NAND gate circuit.

14. The counter circuit according to claim 1, wherein each of said first to n-th, second logic circuits comprises:

an exclusive-NOR gate circuit for receiving the output signal of said flip-flop circuit corresponding to the same bit, and for receiving the second signal outputted from said latch circuit corresponding to the same bit;

an inverter circuit for receiving said carry signal from the second logic circuit corresponding to the less significant bit; and a NOR gate circuit for receiving an output signal of said inverter circuit and an output signal from said exclusive-NOR gate circuit.

15. The counter circuit according to claim 3, wherein each of said first to n-th, third logic circuits comprises:

an exclusive-NOR gate circuit for receiving an output signal of said first logic circuit corresponding to the same bit and the first signal outputted from said latch circuit corresponding to the same bit;

a NAND gate circuit for receiving said overflow signal from the third logic circuit corresponding to the less significant bit and an output signal from said exclusive-NOR gate circuit; and an inverter circuit for receiving an output signal from said NAND gate circuit.

16. The counter circuit according to claim 1, wherein each of said first to n-th, third logic circuits comprises:

an exclusive-OR gate circuit for receiving an output signal of said first logic circuit corresponding to the same bit and the first signal from said latch circuit corresponding to the same bit;

an inverter circuit for receiving said overflow signal from the third logic circuit corresponding to the less significant bit; and a NOR gate circuit for receiving an output signal of said inverter circuit and an output signal from said exclusive-OR gate circuit.

17. A semiconductor memory comprising:

a burst counter circuit for operating in accordance with both a linear sequence and an interleave sequence, said burst counter circuit having a changeable burst length; and a control circuit for receiving an address signal, controlling said burst counter circuit in accordance with the address signal such that said burst counter circuit operates in one of said linear sequence and said interleave sequence, and outputting a control signal for setting the burst length of said burst counter circuit.

18. A semiconductor memory comprising:

a memory cell array having a plurality of memory cells, a plurality of word lines and a plurality of bit lines, each of said plurality of memory cells being arranged at an intersection of one of said word lines and one of said bit lines;

an address buffer for receiving an address signal and generating an internal address signal from the address signal;

a row decoder for receiving said internal address signal and selecting one of the word lines within said memory cells based on the internal address signal;

a burst counter circuit operable in accordance with a linear sequence and an interleave sequence, for generating an internal column address signal used when a burst mode operation is executed, the internal column address signal representing n bits ranging from lowest to highest significance, the burst counter circuit for supplying the internal column address signal to said address buffer;

a mode setting circuit for generating a mode setting signal and supplying the mode setting signal to said burst counter circuit, a sequence mode of said burst counter circuit big set according to the mode setting signal; and a column decoder for generating a column selection signal for selecting a bit line within said memory cell arrays based on the internal address signal from said address buffer, wherein said burst counter circuit comprises:

first to n-th flip-flop circuits, each corresponding to a different one of the n bits each having a first signal input terminal, a second signal input terminal and a count signal output terminal, for receiving a synchronization signal, for receiving, in a first cycle of the synchronization signal when counting starts, a first input signal inputted into said first signal input terminal and outputting an output signal in accordance with the first input signal from the count signal output terminal while the synchronization signal remains in a first logic state, for latching the output signal in accordance with said first input signal while the synchronization signal remains in a second logic state following the first logic state, for receiving in a cycle following the first cycle of the synchronization signal after the counting starts, a second input signal inputted into said second input signal terminal while the synchronization signal is in the first logic state, and for outputting the output signal in accordance with said second input signal from the count signal output terminal while the synchronization signal remains in the second logic state following the first logic state, thereby obtaining first to n-th bit count signals, first to n-th latch circuits, each corresponding to a different one of the n bits, each for receiving the output from said flip-flop circuit corresponding to the same bit, and in the first cycle of said synchronization signal when the counting starts, for latching output signal from the flip-flop circuit corresponding to the same bit and outputting first and second signals, and for setting a logic level of said second signal in accordance with a control signal irrespective of a logic level of the output signal from the corresponding to the same bit, first to n-th, first logic circuits, each corresponding to a different one of the n bits, each for receiving the output signal from said flip-flop circuit corresponding to the same bit, fir receiving a carry signal, for outputting a third signal when the output signal from the flip-flop circuit corresponding to the same bit and the carry signal differ in logic level, and for feeding the third signal as said first input signal to said flip-flop circuit corresponding to the same bit, and first to n-th, second logic circuits, each corresponding to a different one of the n bits, each for receiving the output signal from said flip-flop circuit corresponding to the same bit, each of the second to n-th second logic circuit for receiving said carry signal from one of the second logic circuits corresponding to a less significant bit and said second signal outputted from the latch circuit corresponding to the same bit, and outputting said carry signal to one of each of the first and second logic circuits corresponding to a more significant bit when the output signal from the corresponding flip-flop circuit and the second signal outputted from the latch circuit corresponding to the same bit differ from each other in logic level.

19. A semiconductor memory according to claim 18, wherein said mode setting circuit is configured to determine the mode setting signal when the logic of said address signal is in a specific state.

* * * * *

UNITED STATES PATENT AND TRADEMARK OFFICE
CERTIFICATE OF CORRECTION

PATENT NO. : 6,078,636
DATED : June 20, 2000
INVENTOR(S) : Yutaka Shirai, et al

It is certified that error appears in the above-identified patent and that said Letters Patent is hereby corrected as shown below:

<u>Claim 16, Column 24:</u>
Line 1, "claim 1" has been replaced with --claim 3--.

<u>Claim 18, Column 24:</u>
Line 49, "big" has been replaced with --being--.
Line 56, "bits each" has been replaced with --bits, each--.

<u>Column 25:</u>
Line 14, "output from" has been replaced with --output signal from--.
Line 17, "output" has been replaced with --the output--.
Line 22, "corresponding" has been replaced with --flip-flop circuit corresponding--.
Line 26, "fir" has been replaced with --for--.

Signed and Sealed this

Nineteenth Day of June, 2001

*Attest:*

NICHOLAS P. GODICI
*Attesting Officer*     *Acting Director of the United States Patent and Trademark Office*